US012647106B2

(12) United States Patent
Lele et al.

(10) Patent No.: US 12,647,106 B2
(45) Date of Patent: Jun. 2, 2026

(54) STORAGE DEVICE HAVING LATCHING UNITS SERIALLY CONNECTED FOR IN-MEMORY ARITHMETIC OPERATIONS

(71) Applicant: TAIWAN SEMICONDUCTOR MANUFACTURING COMPANY, LTD., Hsinchu (TW)

(72) Inventors: Ashwin Sanjay Lele, Hsinchu (TW); Win-San Khwa, Hsinchu (TW); Meng-Fan Chang, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

(21) Appl. No.: 18/663,560

(22) Filed: May 14, 2024

(65) Prior Publication Data

US 2025/0219620 A1     Jul. 3, 2025

Related U.S. Application Data

(60) Provisional application No. 63/615,726, filed on Dec. 28, 2023.

(51) Int. Cl.
| | |
|---|---|
| *H03K 3/037* | (2006.01) |
| *H03K 17/687* | (2006.01) |
| *H03K 19/20* | (2006.01) |

(52) U.S. Cl.
CPC ......... *H03K 3/037* (2013.01); *H03K 17/6872* (2013.01); *H03K 19/20* (2013.01)

(58) Field of Classification Search
CPC .... H03K 3/037; H03K 17/6872; H03K 19/20; G11C 7/1006; G11C 7/1039

USPC ......................................................... 327/225
See application file for complete search history.

(56) References Cited

U.S. PATENT DOCUMENTS

| | | | | |
|---|---|---|---|---|
| 5,132,993 | A | * | 7/1992 | Nishiura .............. G11C 27/024 |
| | | | | 377/79 |
| 5,159,616 | A | * | 10/1992 | Douglas ................. G11C 19/28 |
| | | | | 377/79 |
| 5,471,152 | A | | 11/1995 | Gheewala et al. |
| 5,497,114 | A | * | 3/1996 | Shimozono ........ H03K 3/35625 |
| | | | | 327/212 |
| 5,943,681 | A | * | 8/1999 | Ooishi ................ G06F 12/0804 |
| | | | | 711/E12.04 |
| 6,018,559 | A | * | 1/2000 | Azegami ................ G11C 19/28 |
| | | | | 377/79 |
| 6,462,596 | B1 | * | 10/2002 | Varma .............. H03K 3/356173 |
| | | | | 327/210 |

(Continued)

*Primary Examiner* — Ryan Jager
(74) *Attorney, Agent, or Firm* — Hauptman Ham, LLP

(57) ABSTRACT

A storage device includes an array of latching units and a plurality of inter-unit transmission switches. Each pair of two adjacent latching units is coupled together through an inter-unit transmission switch. Each latching unit includes a first inverter and a first transmission switch serially connected between a first bit node and a second bit node, and a second inverter and a second transmission switch serially connected between the second bit node and the first bit node. The first inverter has an input configured to receive a voltage from the first bit node either directly or through the first transmission switch. The second inverter has an input configured to receive a voltage from the second bit node either directly or through the second transmission switch.

20 Claims, 32 Drawing Sheets

(56) References Cited

U.S. PATENT DOCUMENTS

| | | | |
|---|---|---|---|
| 6,661,727 B2 * | 12/2003 | Hatamian | G01R 31/318552 |
| | | | 365/240 |
| 2003/0063079 A1 * | 4/2003 | Abe | G09G 3/3266 |
| | | | 345/204 |
| 2005/0124945 A1 | 6/2005 | Park | |
| 2013/0077736 A1 * | 3/2013 | Son | G09G 3/2085 |
| | | | 377/64 |
| 2013/0169609 A1 * | 7/2013 | Son | G11C 19/287 |
| | | | 345/209 |
| 2014/0043886 A1 * | 2/2014 | Wu | G11C 7/12 |
| | | | 365/205 |
| 2014/0254249 A1 | 9/2014 | Huang et al. | |
| 2020/0066333 A1 | 2/2020 | Fujiwara et al. | |
| 2025/0219620 A1 * | 7/2025 | Lele | H03K 3/037 |

* cited by examiner long pulse operation of forward-shifting storage mode short pulse operation of backward-shifting storage mode short pulse operation of backward-shifting storage mode short pulse operation of backward-shifting storage mode short pulse operation of forward-shifting storage mode short pulse operation of forward-shifting storage mode short pulse operation of forward-shifting storage mode short pulse operation of forward-shifting storage mode

| Standard | Thermometer | Thermometer-like | Encoding-1 | Encoding-2 | Encoding-3 |
|---|---|---|---|---|---|
| 1610 | 1620 | 1630 | 1640 | 1650 | 1660 |
| 00 | 0000 | 1100 | 0 | 0 | 1 |
| 01 | 0001 | 1101 | 1 | 4 | 2 |
| 10 | 0011 | 1111 | 2 | 8 | 4 |
| 11 | 0111 | 1011 | 3 | 12 | 8 |
| 100 | 1111 | 0011 | 4 | 16 | 16 |
| | | | Data movement corresponds to +/-1 | Data movement corresponds to +/-4 | Data movement corresponds to mult/divide 2 |

FIG. 16

| Unit 2 | Unit 1 | Unit 0 | PVA stored value | Encoded decimal value |
|---|---|---|---|---|
| 1100 | 1100 | 1100 | $16 \times 0 + 4 \times 0 + 1 \times 0$ | 0 |
| 1100 | 1100 | 1101 | $16 \times 0 + 4 \times 0 + 1 \times 1$ | 1 |
| 1100 | 1100 | 1111 | $16 \times 0 + 4 \times 0 + 1 \times 2$ | 2 |
| 1100 | 1100 | 1011 | $16 \times 0 + 4 \times 0 + 1 \times 3$ | 3 |
| 1100 | 1101 | 1100 | $16 \times 0 + 4 \times 1 + 1 \times 0$ | 4 |
| 1100 | 1101 | 1101 | $16 \times 0 + 4 \times 1 + 1 \times 1$ | 5 |
| . . . | | | | . . . |
| 1011 | 1011 | 1011 | $16 \times 3 + 4 \times 3 + 1 \times 2$ | 62 |
| 1011 | 1011 | 1011 | $16 \times 3 + 4 \times 3 + 1 \times 3$ | 63 |
| 0011 | 1100 | 1100 | $16 \times 4 + 4 \times 0 + 1 \times 0$ | 64 |

FIG. 21B

Matrix A: Stored in memory

Fixed matrix to be added

Matrix A: Stored in memory

Fixed matrix to be added

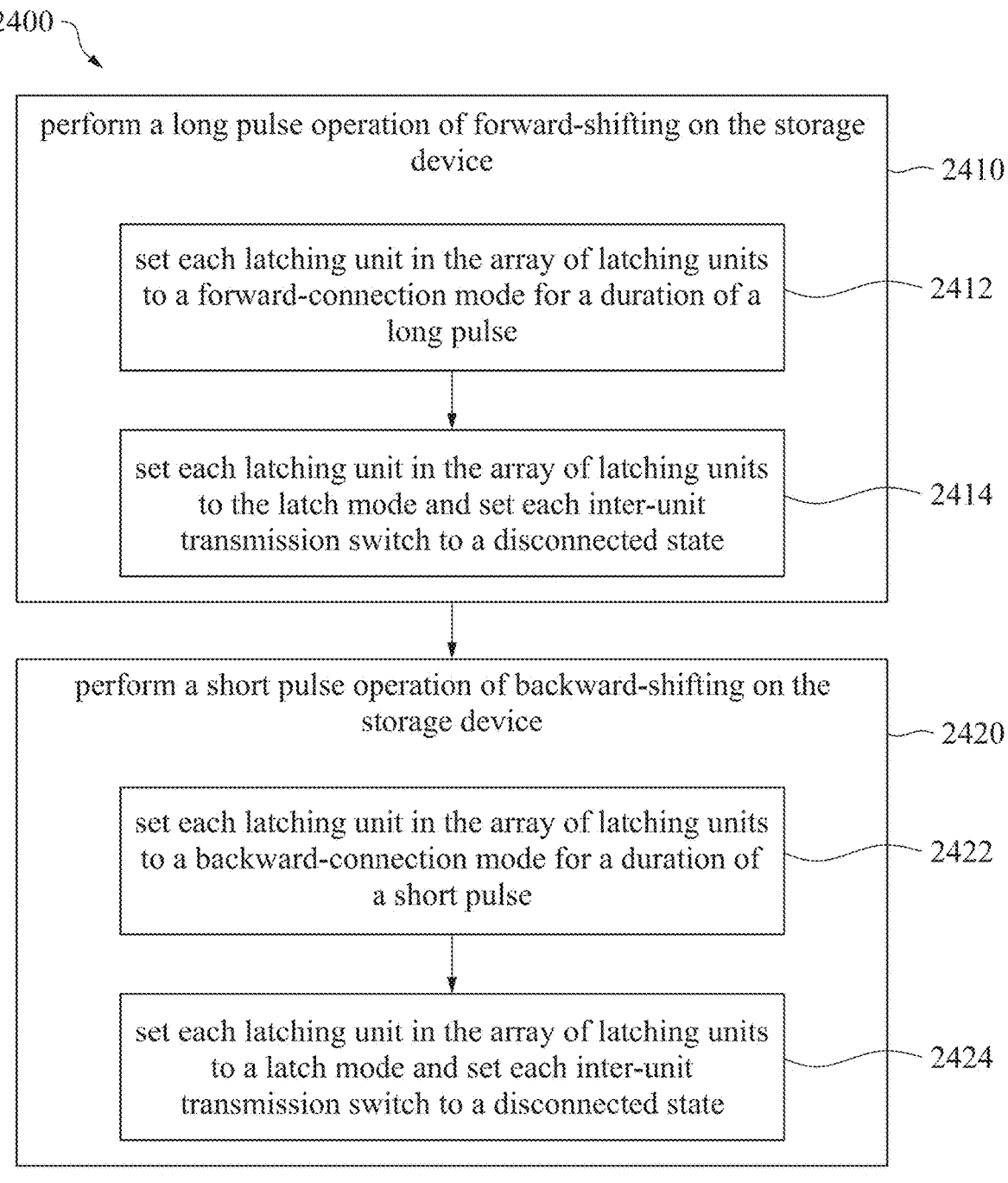

perform a long pulse operation of forward-shifting on the storage device — 2410 set each latching unit in the array of latching units to a forward-connection mode for a duration of a long pulse — 2412 set each latching unit in the array of latching units to the latch mode and set each inter-unit transmission switch to a disconnected state — 2414 perform a short pulse operation of backward-shifting on the storage device — 2420 set each latching unit in the array of latching units to a backward-connection mode for a duration of a short pulse — 2422 set each latching unit in the array of latching units to a latch mode and set each inter-unit transmission switch to a disconnected state — 2424

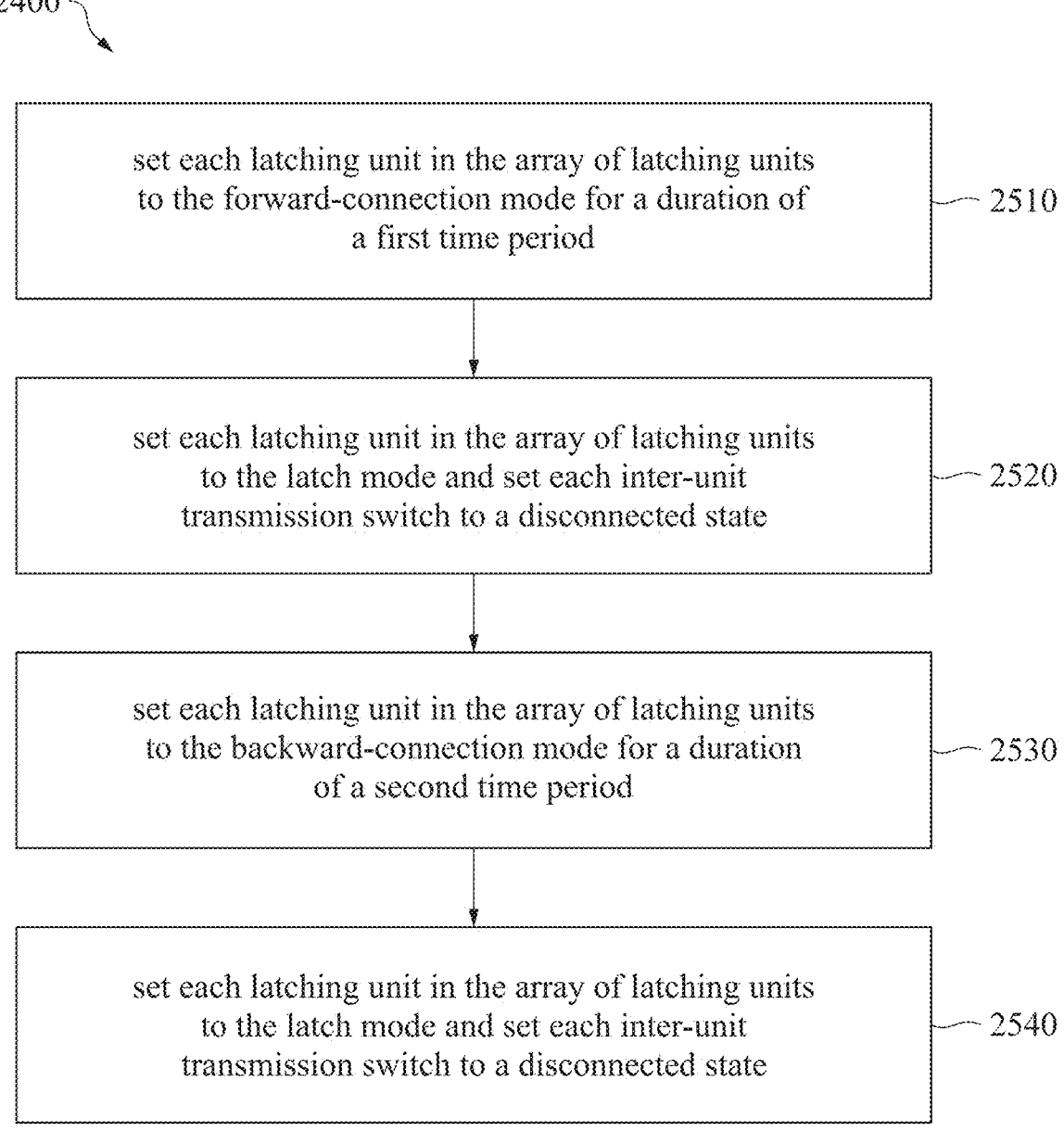

set each latching unit in the array of latching units
to the forward-connection mode for a duration of
a first time period       2510 set each latching unit in the array of latching units
to the latch mode and set each inter-unit
transmission switch to a disconnected state       2520 set each latching unit in the array of latching units
to the backward-connection mode for a duration
of a second time period       2530 set each latching unit in the array of latching units
to the latch mode and set each inter-unit
transmission switch to a disconnected state       2540

FIG. 25

STORAGE DEVICE HAVING LATCHING UNITS SERIALLY CONNECTED FOR IN-MEMORY ARITHMETIC OPERATIONS

CROSS-REFERENCE TO RELATED APPLICATIONS

This application claims the benefit of U.S. Provisional Application No. 63/615,726, filed Dec. 28, 2023, which is hereby incorporated by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16 is a table of various coding schemes for coding the states of a storage device having latching units, in accordance with some embodiments.

FIG. 21B is a table which maps the combination of the states of the three storage units to the coded number written with decimal values, in accordance with some embodiments.

FIGS. 23A-23B are tables of the matrixes to be added together, in accordance with some embodiments.

FIG. 24 is a flowchart of a method of operating a storage device, in accordance with some embodiments.

FIG. 25 is a flowchart of a method of operating a storage device, in accordance with some embodiments.

DETAILED DESCRIPTION

Figure 1:
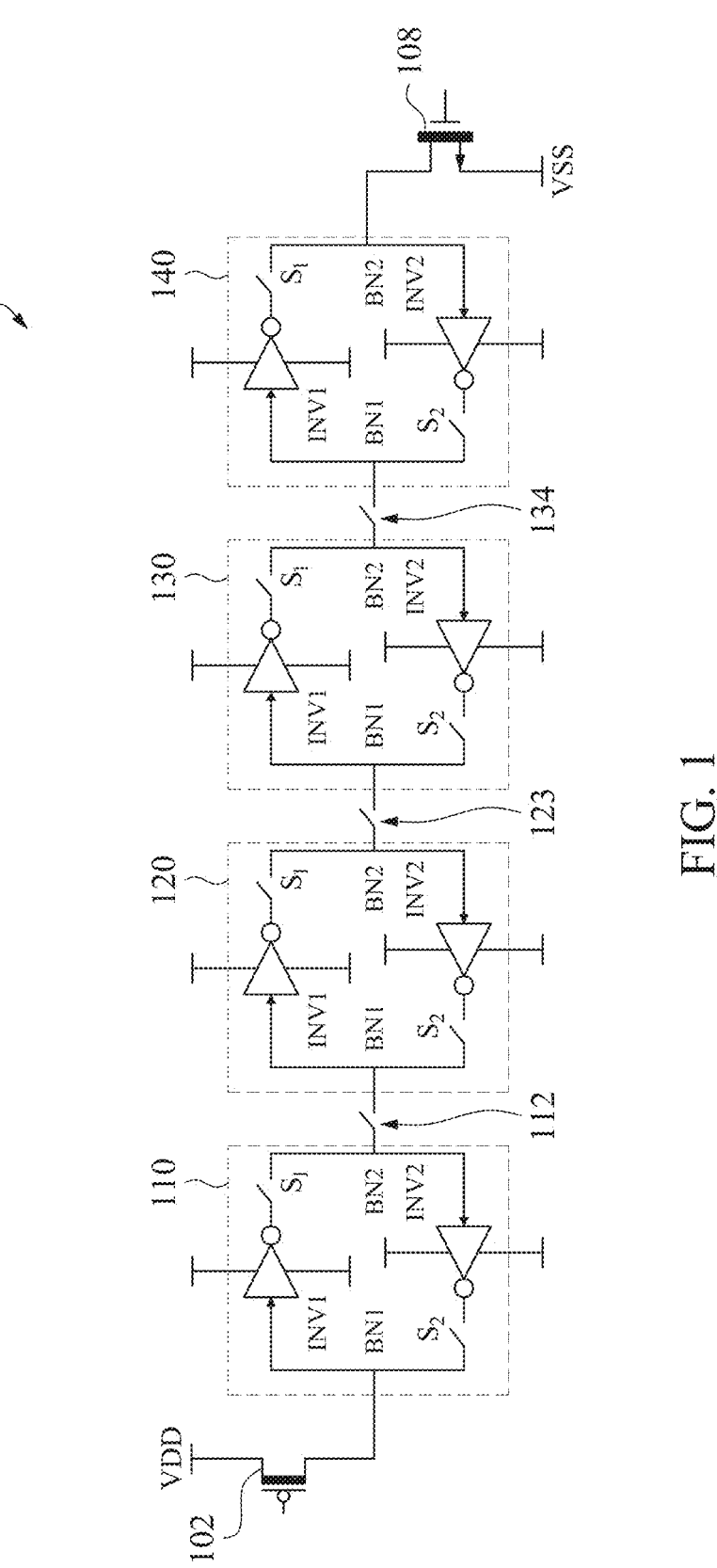
FIG. 1 is a circuit diagram of a storage device having an array of latching units, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a storage device includes an array of latching units, and a plurality of inter-unit transmission gates. Each pair of two adjacent latching units is coupled together through an inter-unit transmission gate. Each latching unit includes a first inverter and a first transmission gate serially connected between a first bit node and a second bit node, the first inverter having an input configured to receive a voltage from the first bit node either directly or through the first transmission gate, and a second inverter and a second transmission gate serially connected between the second bit node and the first bit node, the second inverter having an input configured to receive a voltage from the second bit node either directly or through the second transmission gate. Arithmetic operations are implemented with the storage device operating as a finite state machine. The change of the states of the storage device are controlled based on the timings of various pulses. Concurrent arithmetic operations in multiple rows of storage devices provides computational speed improvements, as compared with row-by-row arithmetic operations.

FIG. 1 is a circuit diagram of a storage device having an array of latching units, in accordance with some embodiments. In FIG. 1, a storage device 100 includes latching units 110-140, a PMOS transistor 102, an NMOS transistor 108, and inter-unit transmission switches 112, 123, and 134. The latching units are serially coupled between the drain of the PMOS transistor 102 and the drain of the NMOS transistor 108, while the source of the PMOS transistor 102 and the source of the NMOS transistor are correspondingly connected to an upper supply voltage VDD and a lower supply voltage VSS. The latching unit 110 and the latching unit 120, as a pair of two adjacent latching units, are coupled together through the inter-unit transmission switch 112. The latching unit 120 and the latching unit 130, as a pair of two adjacent latching units, are coupled together through the inter-unit transmission switch 123. The latching unit 130 and the latching unit 140, as a pair of two adjacent latching units, are coupled together through the inter-unit transmission switch 134.

Each of the latching units 110-140 includes a first inverter INV1 and a first transmission switch S1 serially connected between a first bit node BN1 and a second bit node BN2. Each of the latching units 110-140 also includes a second inverter INV2 and a second transmission switch S2 serially connected between the second bit node BN2 and the first bit node BN1. The inter-unit transmission switch 112 connects the second bit node BN2 of the latching unit 110 with the first bit node BN1 of the latching unit 120. The inter-unit transmission switch 123 connects the second bit node BN2 of the latching unit 120 with the first bit node BN1 of the latching unit 130. The inter-unit transmission switch 134 connects the second bit node BN2 of the latching unit 130 with the first bit node BN1 of the latching unit 140.

In each of the latching units of FIG. 1, the input of the first inverter INV1 is directly connected to the first bit node BN1, and the input of the second inverter INV2 is directly connected to the second bit node BN2. In some alternative embodiments, the input of the first inverter INV1 is electrically coupled to the first bit node BN1 through the first transmission switch S1 while the first transmission switch S1 is directly connected to the first bit node BN1. In some alternative embodiments, the input of the second inverter INV2 is electrically coupled to the second bit node BN2 through the second transmission switch S2 while the second transmission switch S2 is directly connected to the second bit node BN2.

In FIG. 1, the storage device includes various transmission switches, such as, the inter-unit transmission switches 112, 123, and 134, the first transmission switches S1, and the second transmission switches S2. Each of the transmission switches is operable either in a connected state (i.e., in a closed state) or in a disconnected state (i.e., in a disclosed state). The two terminals of an inter-unit transmission switch operated in the connected state are conductivity connected together (as the switch is closed), but the two terminals of an inter-unit transmission switch operated in the disconnected state are electrically isolated from each other (as the switch is opened).

FIGS. 2A-2D are circuit diagrams of latching units implemented with various configurations, in accordance with some embodiments. In the example circuits of FIGS. 2A-2D, each of the transmission switches is implemented as a transmission gate which is formed with a PMOS transistor and an NMOS transistor parallely connected between the two terminals of the transmission switch. Other implementations of transmission switches are within the contemplated scope of the present disclosure. In the example circuits of FIGS. 2A-2C, each of the inverters (such as the first inverter INV1 and the second inverter INV2) is implemented with a PMOS transistor and an NMOS transistor. In each inverter, the gates of the transistors are connected together as the input of the inverter, the drains of the transistors are connected together as the output of the inverter, and the channels of the transistors are serially connected between the upper supply voltage VDD and between the lower supply voltage VSS. Other implementations of inverters are within the contemplated scope of the present disclosure.

Figure 2A:
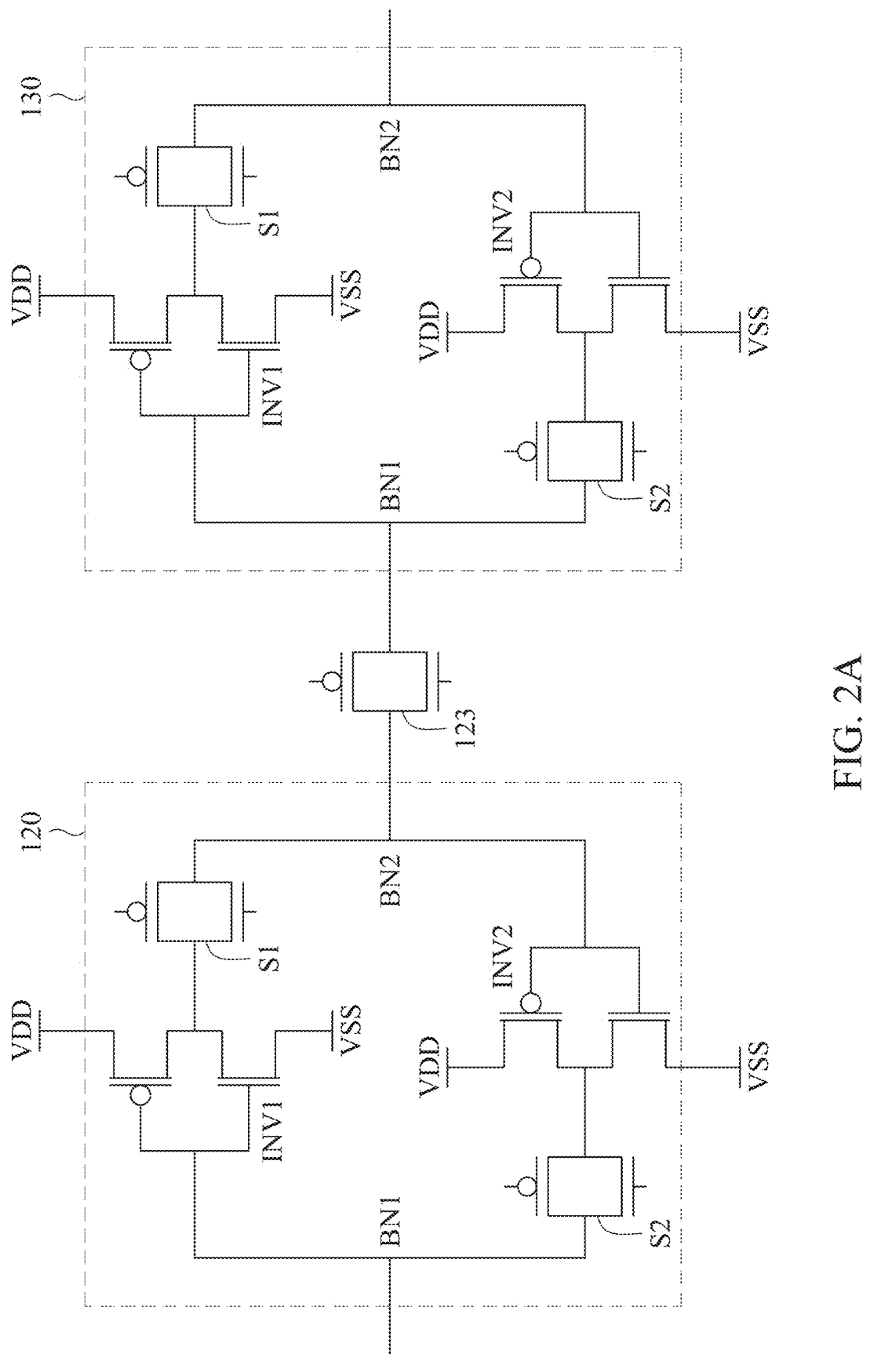
FIGS. 2A-2D are circuit diagrams of latching units implemented with various configurations, in accordance with some embodiments.

In FIG. 2A, the input of the first inverter INV1 is directly connected to the first bit node BN1, and the output of the first inverter INV1 is electrically coupled to the second bit node BN2 through the first transmission switch S1. The input of the second inverter INV2 is directly connected to the second bit node BN2, and the output of the second inverter INV2 is electrically coupled to the first bit node BN1 through the second transmission switch S2.

Figure 2B:
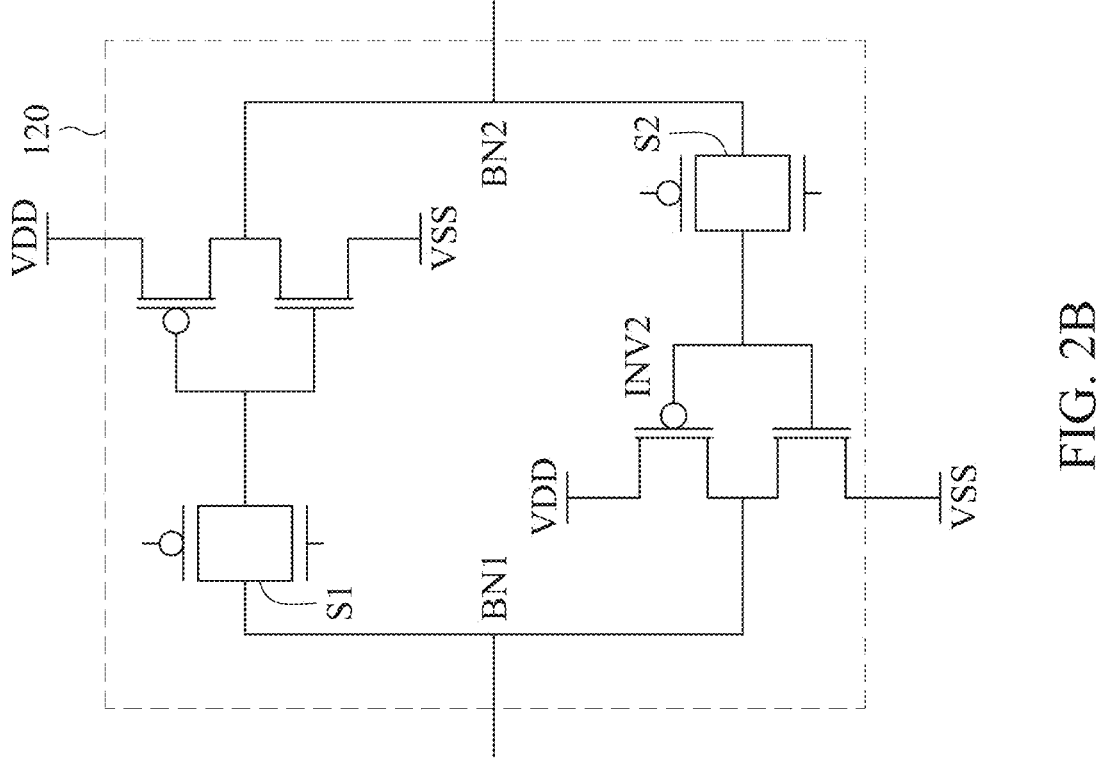

In FIG. 2B, the input of the first inverter INV1 is electrically coupled to the first bit node BN1 through the first transmission switch S1, and the output of the first inverter INV1 is directly connected to the second bit node BN2. The input of the second inverter INV2 is electrically coupled to the second bit node BN2 through the second transmission switch S2, and the output of the second inverter INV2 is directly connected to the first bit node BN1.

Figure 2D:
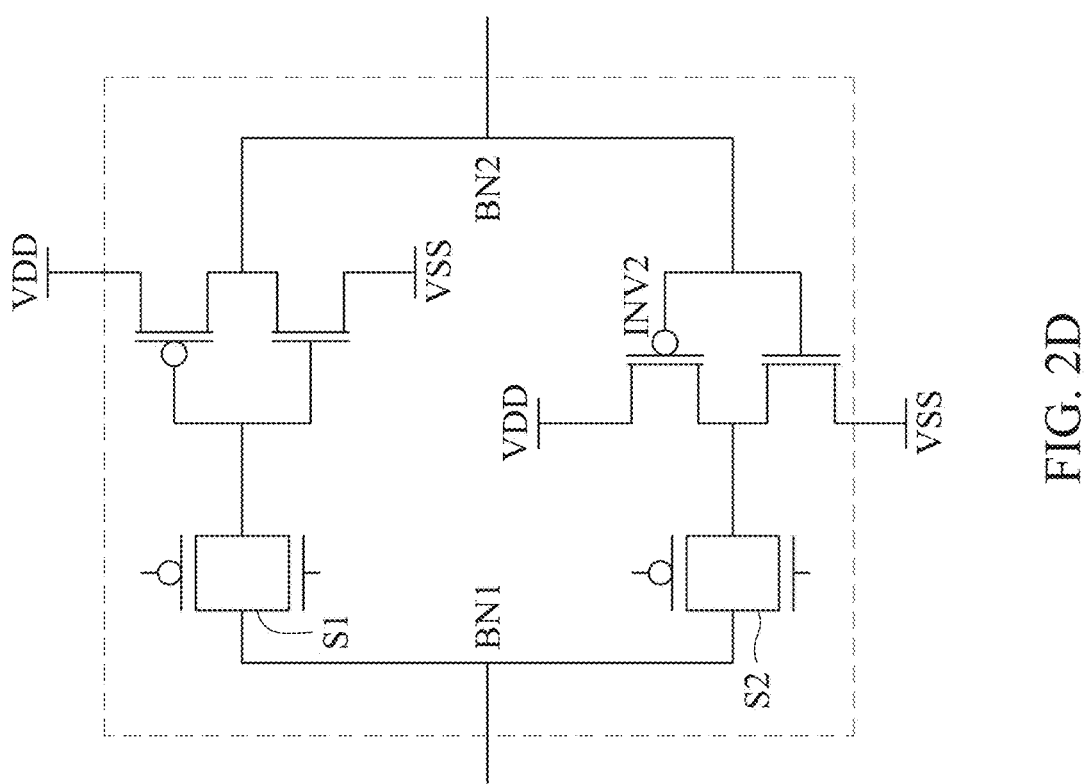
Figure 2C:
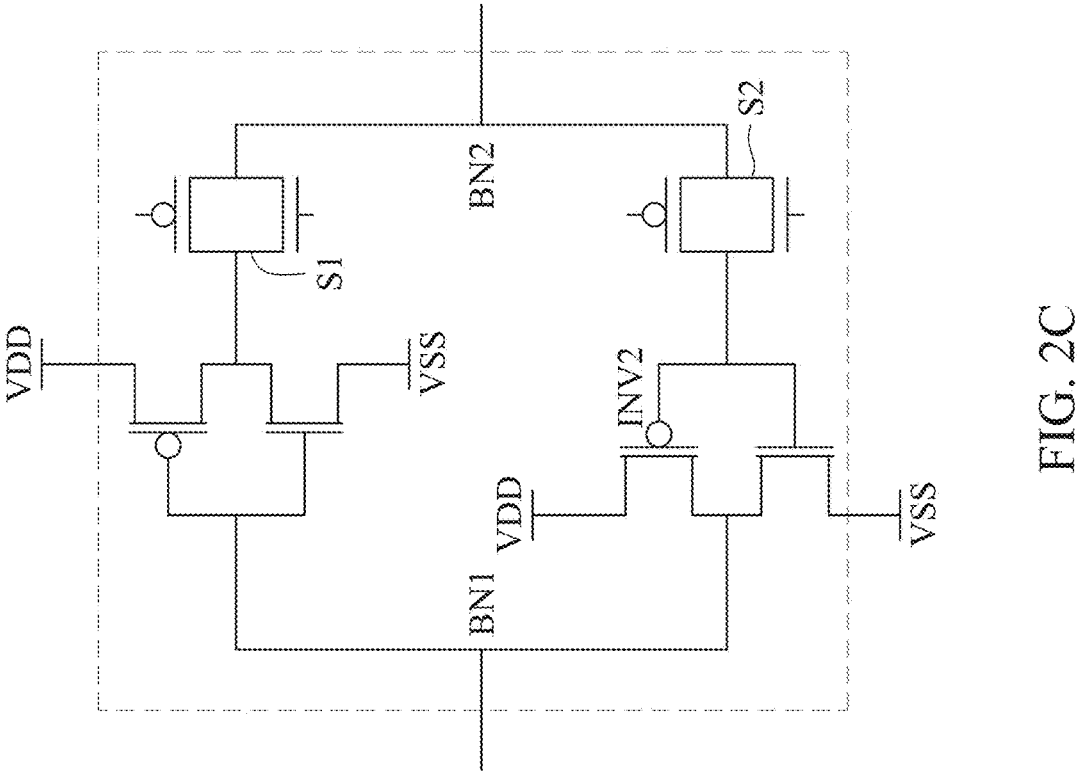

In FIG. 2C, the input of the first inverter INV1 is directly connected to the first bit node BN1, and the output of the first inverter INV1 is electrically coupled to the second bit node BN2 through the first transmission switch S1. The input of the second inverter INV2 is electrically coupled to the second bit node BN2 through the second transmission switch S2, and the output of the second inverter INV2 is directly connected to the first bit node BN1.

In FIG. 2D, the input of the first inverter INV1 is electrically coupled to the first bit node BN1 through the first transmission switch S1, and the output of the first inverter INV1 is directly connected to the second bit node BN2. The input of the second inverter INV2 is directly connected to the second bit node BN2, and the output of the second inverter INV2 is electrically coupled to the first bit node BN1 through the second transmission switch S2.

Figure 3A:
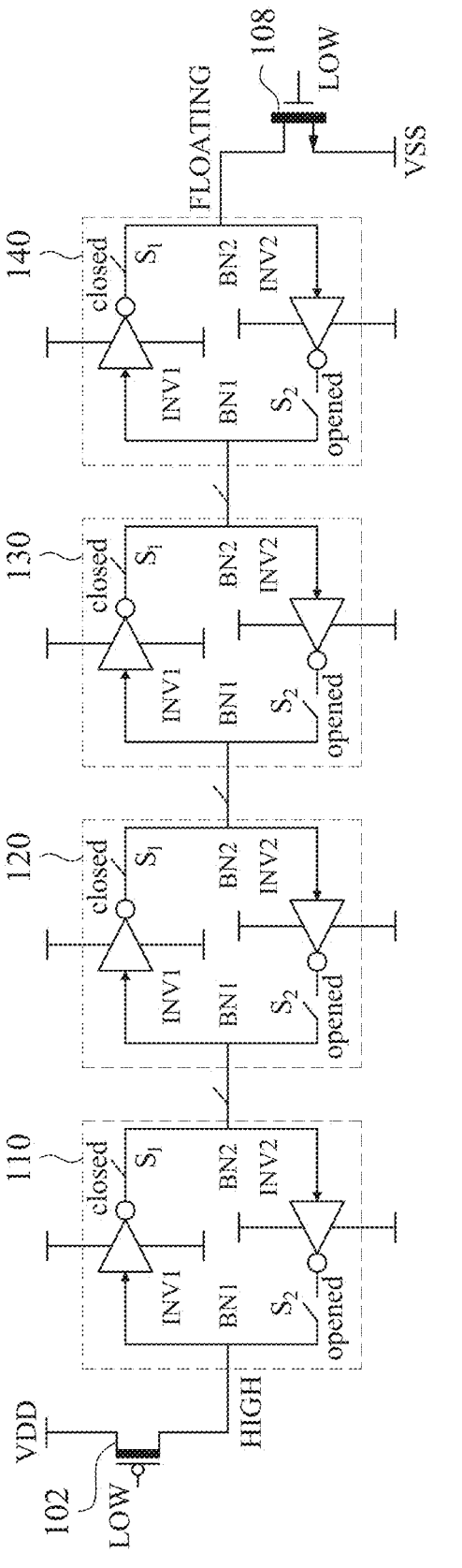
FIGS. 3A-3C are three circuit diagrams of a storage device operated in one of the three operation modes, in accordance with some embodiments.
Figure 3B:
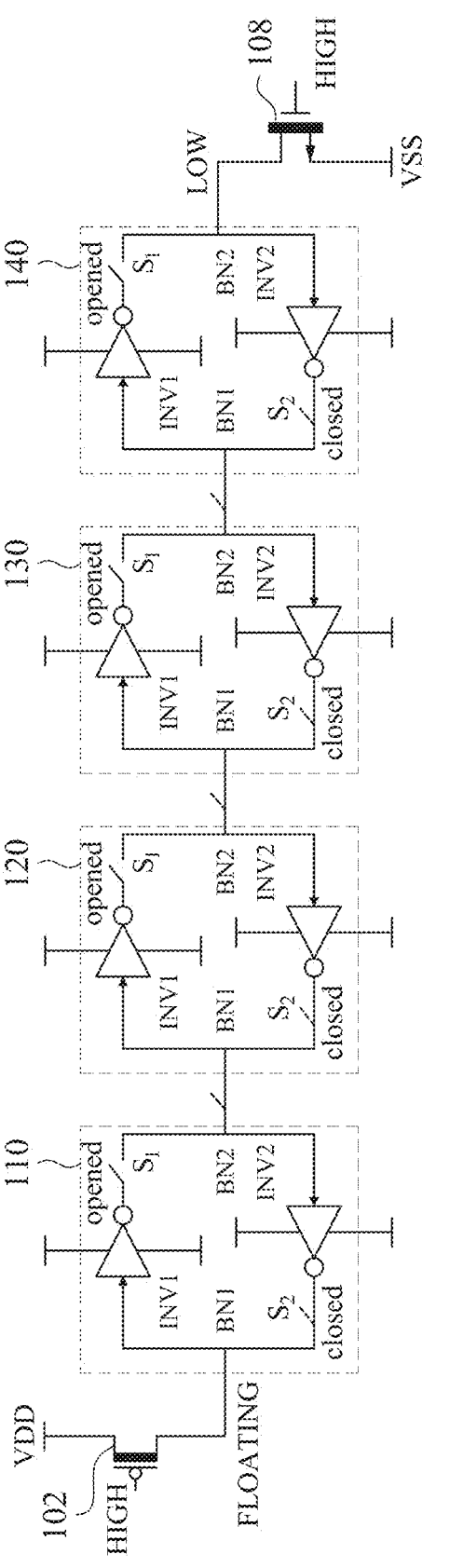
Figure 3C:
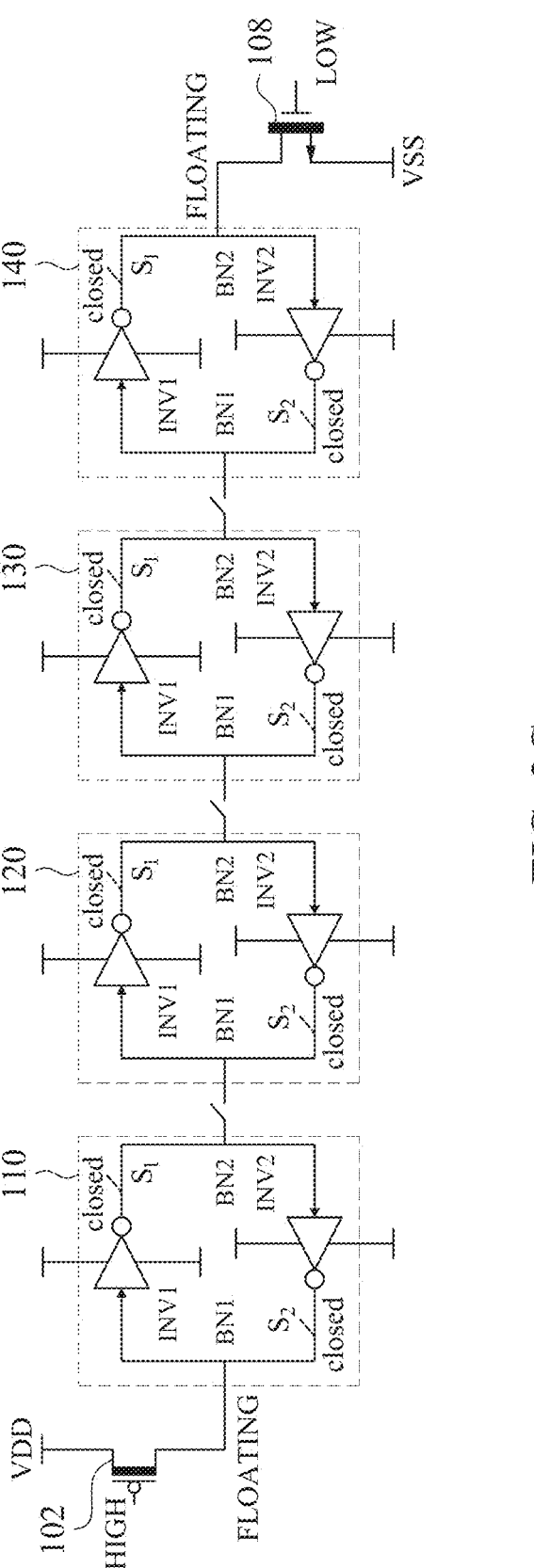

In FIG. 1 and FIGS. 2A-2D, each latching unit is operable in three operation modes: a forward-connection mode, a backward-connection mode, and a latch mode. A storage device having serially coupled latching units is operable in three operation modes: a forward-shifting mode, a backward-shifting mode, and a storage mode. FIGS. 3A-3C are three circuit diagrams of the storage device 100 of FIG. 1 operated in one of the three operation modes, in accordance with some embodiments. Each latching unit in the storage device 100 in FIGS. 3A-3C is correspondingly operated in the forward-connection mode, the backward-connection mode, and the latch mode.

A storage device having multiple latching units generally includes a first latching unit, a last latching unit, and remaining latching units serially coupled between the first latching unit and the last latching unit. In the example storage device of FIG. 1, the first latching unit is the latching unit 110, and the last latching unit is the latching unit 140. The latching unit 120 and the latching unit 130, as the remaining latching units, are serially coupled between the latching unit 110 and the latching unit 140.

In FIG. 3A, each of the latching units 110-140 is operated in a forward-connection mode, and each inter-unit transmission switch 112, 123, and 134 is set to the connected state. In operations of setting a latching unit to the forward-connection mode, the first transmission switch S1 in the latching unit is set to the connected state, and the second transmission switch S2 in the latching unit is set to the disconnected state.

Additionally, the storage device 100 in FIG. 3A is operated in the forward-shifting mode. In operations of setting a storage device to the forward-shifting mode, in addition to setting each latching unit (e.g., 110-140) to the forward-connection mode and setting each inter-unit transmission switch (e.g., 112, 123, and 134) to the connected state, the first bit node BN1 of the first latching unit (e.g., 110) is held at a voltage of a fixed logic level, and the second bit node BN2 of the last latching unit (e.g., 140) is kept at floating. In the example implementation of FIG. 3A, in response to a logic LOW voltage applied to the gate of the PMOS transistor 102, the first bit node BN1 of the latching unit 110 (as the first latching unit) is conductively connected to the upper supply voltage VDD while the PMOS transistor 102 is set to a conducting state. Furthermore, in response to a logic LOW voltage applied to the gate of the NMOS transistor 108, the second bit node BN2 of the latching unit 140 (as the last latching unit) is maintained at floating while the NMOS transistor 108 is set to a non-conducting state.

In FIG. 3B, each of the latching units 110-140 is operated in a backward-connection mode, and each inter-unit transmission switch 112, 123, and 134 is set to the connected state. In operations of setting a latching unit to the backward-connection mode, the first transmission switch S1 in the latching unit is set to the disconnected state, and the second transmission switch S2 in the latching unit is set to the connected state.

Additionally, the storage device 100 in FIG. 3B is operated in the backward-shifting mode. In operations of setting a storage device to the backward-shifting mode, in addition to setting each latching unit (e.g., 110-140) to the backward-connection mode and setting each inter-unit transmission switch (e.g., 112, 123, and 134) to the connected state, the first bit node BN1 of the first latching unit (e.g., 110) is kept at floating, and the second bit node BN2 of the last latching unit (e.g., 140) is held at a voltage of a fixed logic level. In the example implementation of FIG. 3B, in response to a logic HIGH voltage applied to the gate of the PMOS transistor 102, the first bit node BN1 of the latching unit 110 (as the first latching unit) is maintained at floating while the PMOS transistor 102 is set to a non-conducting state. Furthermore, in response to a logic HIGH voltage applied to the gate of the NMOS transistor 108, the second bit node BN2 of the latching unit 140 (as the last latching unit) is conductively connected to the lower supply voltage VSS while the NMOS transistor 108 is set to a conducting state.

In FIG. 3C, each of the latching units 110-140 is operated in a latch mode and each inter-unit transmission switch 112, 123, and 134 is set to the disconnected state. In operations of setting a latching unit to the latch mode, the first transmission switch S1 in the latching unit is set to the connected state, and the second transmission switch S2 in the latching unit is set to the connected state.

Additionally, the storage device 100 in FIG. 3C is operated in the storage mode. In operations of setting a storage device to the storage mode, in addition to setting each latching unit (e.g., 110-140) to the latch mode and setting each inter-unit transmission switch (e.g., 112, 123, and 134) to the disconnected state, the first bit node BN1 of the first latching unit (e.g., 110) is kept at floating, and the second bit node BN2 of the last latching unit (e.g., 140) is kept at floating. In the example implementation of FIG. 3A, in response to a logic HIGH voltage applied to the gate of the PMOS transistor 102, the first bit node BN1 of the latching unit 110 (as the first latching unit) is maintained at floating while the PMOS transistor 102 is set to a non-conducting state. Furthermore, in response to a logic LOW voltage applied to the gate of the NMOS transistor 108, the second bit node BN2 of the latching unit 140 (as the last latching unit) is maintained at floating while the NMOS transistor 108 is set to a non-conducting state.

The storage device 100 of FIG. 1 is operable as a finite state machine for storing digital information. The state of the finite state machine is identified by the state of each latching unit in the storage device while the storage device is operating in the storage mode. In each latching unit, the state of the latching unit is identified by the voltage level at the first bit node BN1 or by the voltage level at the second bit node BN2. In FIG. 1, the state of the storage device 100 (as a finite state machine) is identified by the state of each of the latching units 110-140. In one specific implementation, as shown in FIG. 4, the state b0 of the latching unit 110 is identified by the voltage level at the first bit node BN1 of the latching unit 110, the state b1 of the latching unit 120 is identified by the voltage level at the second bit node BN2 of the latching unit 120, the state b2 of the latching unit 130 is identified by the voltage level at the second bit node BN2 of the latching unit 130, and the state b3 of the latching unit 140 is identified by the voltage level at the first bit node BN1 of the latching unit 140.

The voltage level at each bit node (e.g., BN1 or BN2) is either at the voltage HIGH or the voltage LOW. Each of the voltage HIGH and the voltage LOW is interpreted as one of the two binary logic voltage levels. The voltage range of the voltage HIGH and the voltage range of the voltage LOW often depend on the specific implementation of the inverters used in the latching units. For the latching units implemented as shown in FIGS. 2A-2D, the voltage HIGH is in a range from $VDD-\Delta_H$ to VDD, and the voltage LOW is in a range from VSS to $VSS+\Delta_L$, where $VDD-\Delta_H$ is larger than $VSS+\Delta_L$.

Figure 4:
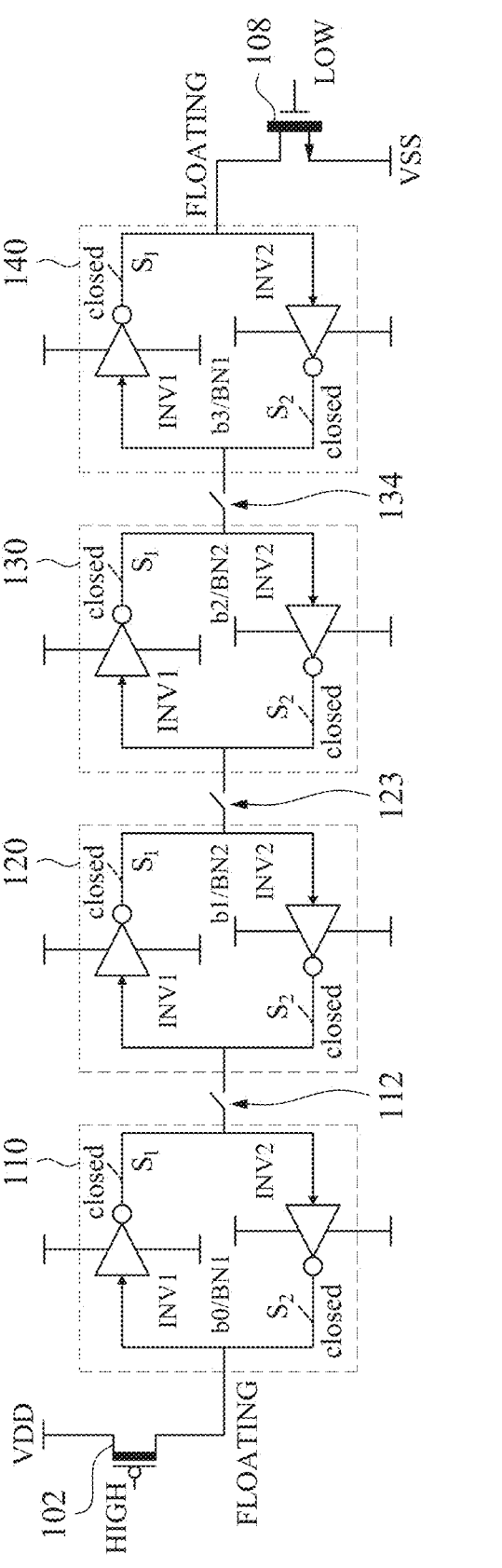
FIG. 4 is a circuit diagram of a storage device having an array of latching units, in accordance with some embodiments.

In FIG. 4, the state of the storage device 100 is identifiable with the combination "$b_0b_1b_2b_3$", where each of the bit values $b_0$, $b_1$, $b_2$, and $b_3$ is correspondingly the state of one of the latching units 110, 120, 130, and 140. In one coding scheme, the voltage HIGH is associated with binary "1", and the voltage LOW is associated with binary "0". The five states of the storage device in FIG. 4 are "1100", "1101", "1111", "1011", and "0011".

The state of the storage device 100 is maintained while the storage device 100 is at the storage mode. The change of the state of the storage device 100, however, occurs during the time period when the storage device is at the forward-shifting mode or at the backward-shifting mode. In some embodiments, with a long pulse operation of forward-shifting, the state of the storage device 100 is set to the state "1100". Furthermore, with a short pulse operation of backward-shifting, one of the following happens: the state "1100" is changed to the state "1101", or the state "1101" is changed to the state "1111", the state "1111" is changed to the state "1011", or the state "1011" is changed to the state "0011".

Figures 5A, 5B:
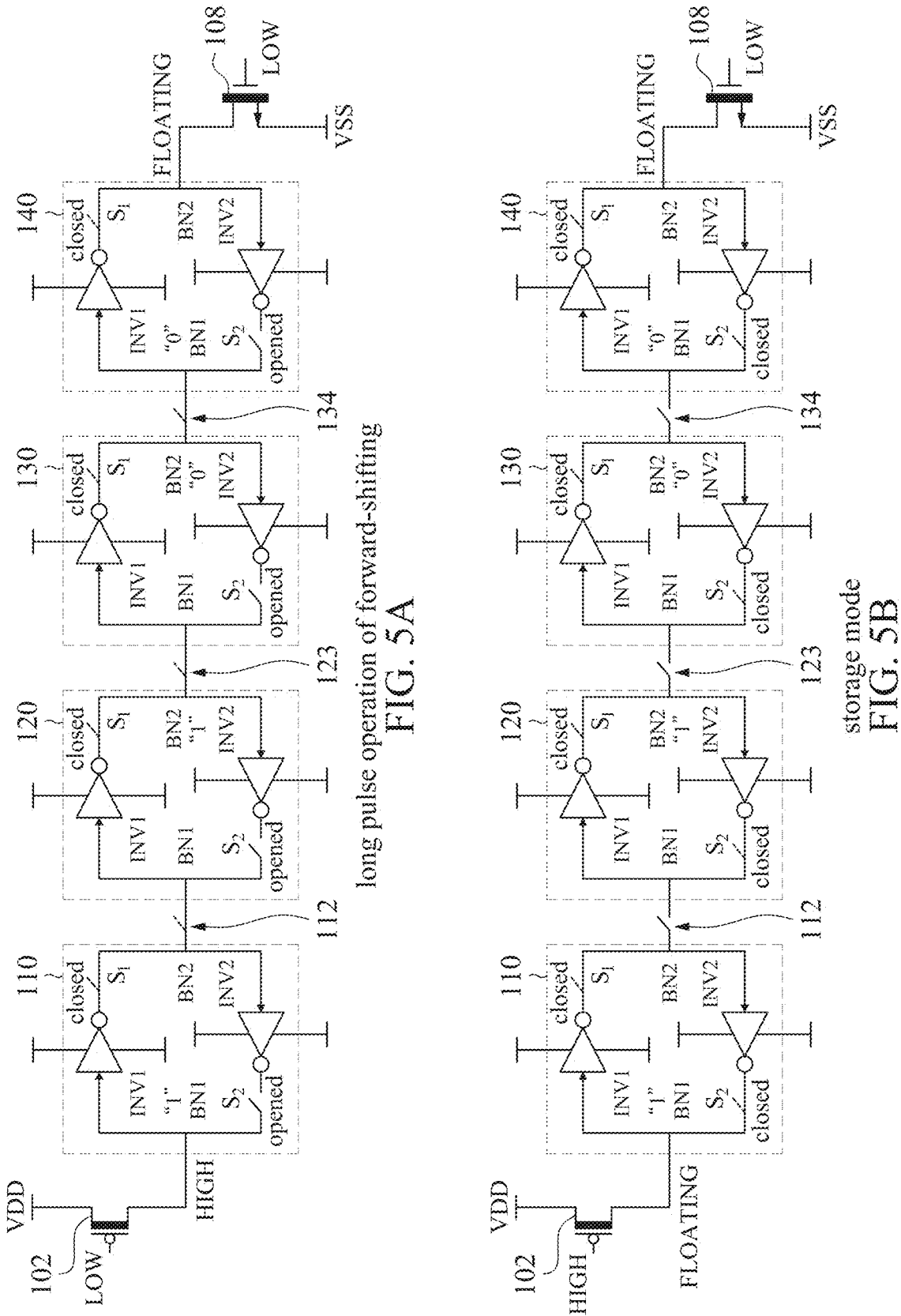
FIGS. 5A-5B are circuit diagrams of a storage device which has a state changed after a long pulse operation of forward-shifting, in accordance with some embodiments.

FIGS. 5A-5B are circuit diagrams of a storage device which has a state changed after a long pulse operation of forward-shifting, in accordance with some embodiments. During the long pulse operation, as shown in FIG. 5A, the storage device is set to the forward-shifting mode. In response to the first bit node BN1 of the latching unit 110 being held at logic HIGH (i.e. $b_0$="1"), the first bit node BN1 of the latching unit 120 is set to logic LOW, and the second bit node BN2 of the latching unit 120 is becomes logic HIGH (i.e., $b_1$="1"). In response to the second bit node BN2 of the latching unit 120 being held at logic HIGH, the first bit node BN1 of the latching unit 130 is set to logic LOW (i.e., $b_2$="0"), and the first bit node BN1 of the latching unit 140 is set to logic LOW (i.e., $b_3$="0"). Consequently, the state of the storage device 100 becomes the state "1100". The time duration of the long pulse operation is designed to be sufficiently long to ensure that the first bit node BN1 of the latching unit 140 becomes logic LOW, as any voltage change at the first bit node BN1 of the first latching unit (i.e., 110) has sufficient time to propagate to the first bit node BN1 of the last latching unit (i.e., 140). In some embodiments, a short pulse operation of backward-shifting immediately follows the long pulse operation of forward-shifting, without setting the storage device to the storage mode first before the start of the short pulse operation. In some embodiments, at the end of the long pulse operation, as shown in FIG. 5B, the storage device is set to the storage mode, and the state "1100" of the storage device is maintained. In some embodiments, after the storage device is set to the storage mode, a short pulse operation of backward-shifting is applied to the storage device.

FIGS. 6A-6B, FIGS. 7A-7B, FIGS. 8A-8B, and FIGS. 9A-9B are circuit diagrams of a storage device which has a state changed after a short pulse operation of backward-shifting, in accordance with some embodiments.

Figures 6A, 6B:
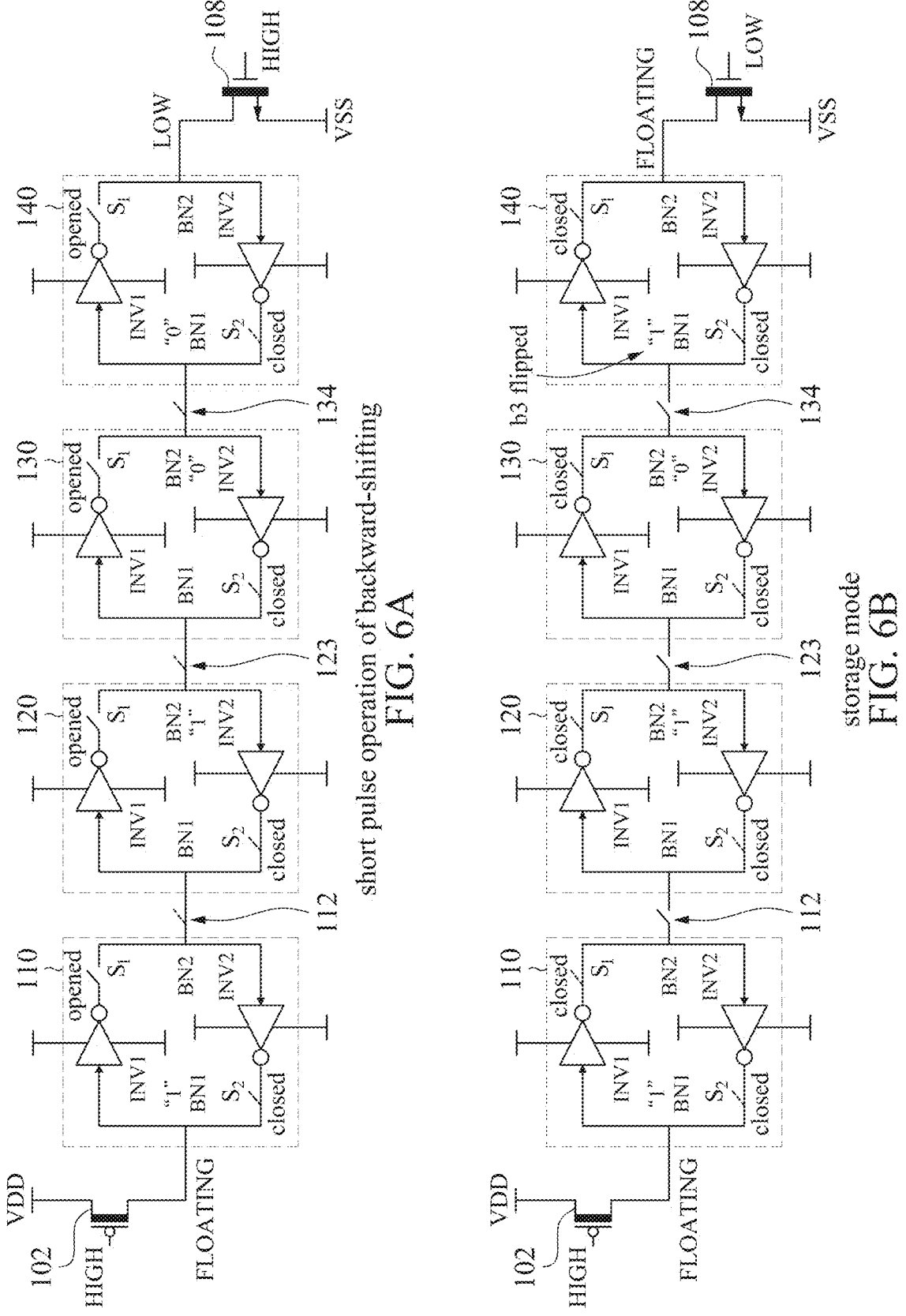
FIGS. 6A-6B, FIGS. 7A-7B, FIGS. 8A-8B, and FIGS. 9A-9B are circuit diagrams of a storage device which has a state changed after a short pulse operation of backward-shifting, in accordance with some embodiments.

In FIGS. 6A-6B, before the short pulse operation of backward-shifting is applied to the storage device, the storage device is at the state "1100". During the short pulse operation, as shown in FIG. 6A, the storage device is set to the backward-shifting mode, and the voltage of the second bit node BN2 of the latching unit 140 is held at logic LOW. The time duration of the short pulse operation is designed to be sufficiently short to ensure that the second bit node BN2 of the latching unit 130 remains at logic LOW (i.e., $b_2$="0"). That is, due to insufficient time of the short pulse operation, a voltage change at the second bit node BN2 of the latching unit 140 does not get propagated to the second bit node BN2 of the latching unit 130.

At the end of the short pulse operation, as shown in FIG. 6B, the storage device is set to the storage mode. After the inter-unit transmission switch 134 is set to the disconnected state, the first bit node BN1 of the latching unit 140 is flipped to logic HIGH (i.e., $b_3$="1") by the second inverter INV2 in the latching unit 140. In some embodiments, during the process of flipping the first bit node BN1 of the latching unit 140 from logic LOW to logic HIGH, the voltage of the second bit node BN2 of the latching unit 140 is held at logic LOW by the capacitance at the input of the second inverter INV2. After the first bit node BN1 of the latching unit 140 is flipped, the first switch S1 is closed, and the storage device is stabilized at the state "1101". In some embodiments, before the first switch S1 is closed, the voltage of the second bit node BN2 of the latching unit 140 is held at logic LOW by the NMOS transistor 108, and after the storage device is stabilized at the state "1101", the NMOS transistor 108 is changed to the non-conducting state. In some alternative embodiments, the NMOS transistor 108 is changed to the non-conducting state without waiting for the closing of the first switch S1.

Figures 7A, 7B:
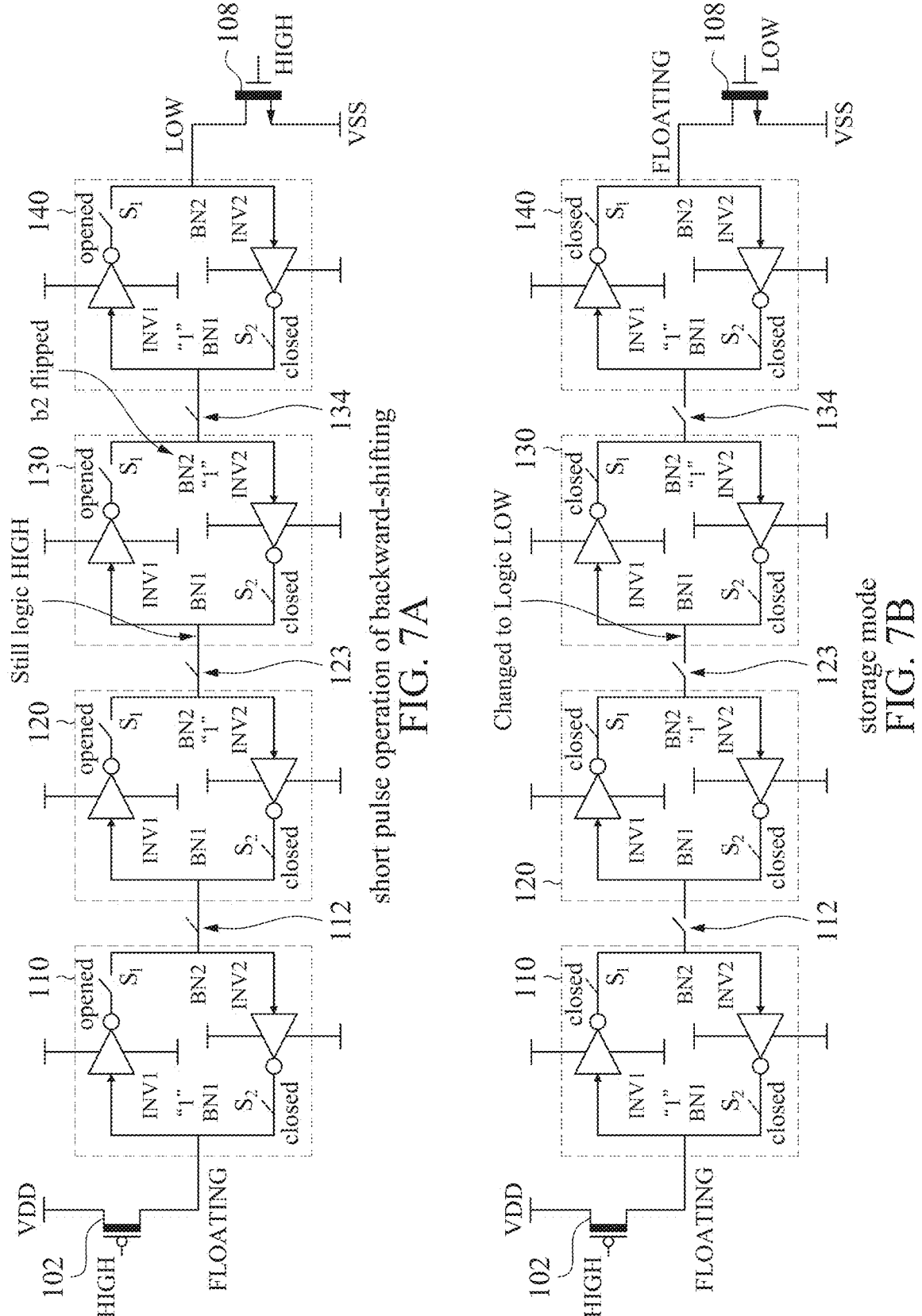

In FIGS. 7A-7B, before the short pulse operation of backward-shifting is applied to the storage device, the storage device is at the state "1101". During the short pulse operation, as shown in FIG. 7A, the storage device is set to the backward-shifting mode, and the voltage of the second bit node BN2 of the latching unit 130 is flipped to logic HIGH (i.e., $b_2$="1"), because of the voltage of logic HIGH at the first bit node BN1 of the latching unit 140. The time duration of the short pulse operation is designed to be sufficiently short to ensure that the second bit node BN2 of the latching unit 120 remains at logic HIGH (i.e., $b_1$="1"). That is, due to insufficient time of the short pulse operation, the voltage change at the second bit node BN2 of the latching unit 130 does not get propagated to the second bit node BN2 of the latching unit 120.

At the end of the short pulse operation, as shown in FIG. 7B, the storage device is set to the storage mode. After the inter-unit transmission switch 123 is set to the disconnected state, the first bit node BN1 of the latching unit 130 is flipped to logic LOW by the second inverter INV2 in the latching unit 130, as the voltage of the second bit node BN2 of the latching unit 130 is held at logic HIGH by the capacitance at the input of the second inverter INV2. Then, the first switch S1 in each latching unit is closed, and the storage device is stabilized at the state "1111". In some embodiments, the NMOS transistor 108 is changed to the non-conducting state before the closing of the first switch S1 in each latching unit. In some embodiments, the NMOS transistor 108 is changed to the non-conducting state without waiting for the closing of the first switch S1 in each latching unit.

Figures 8A, 8B:
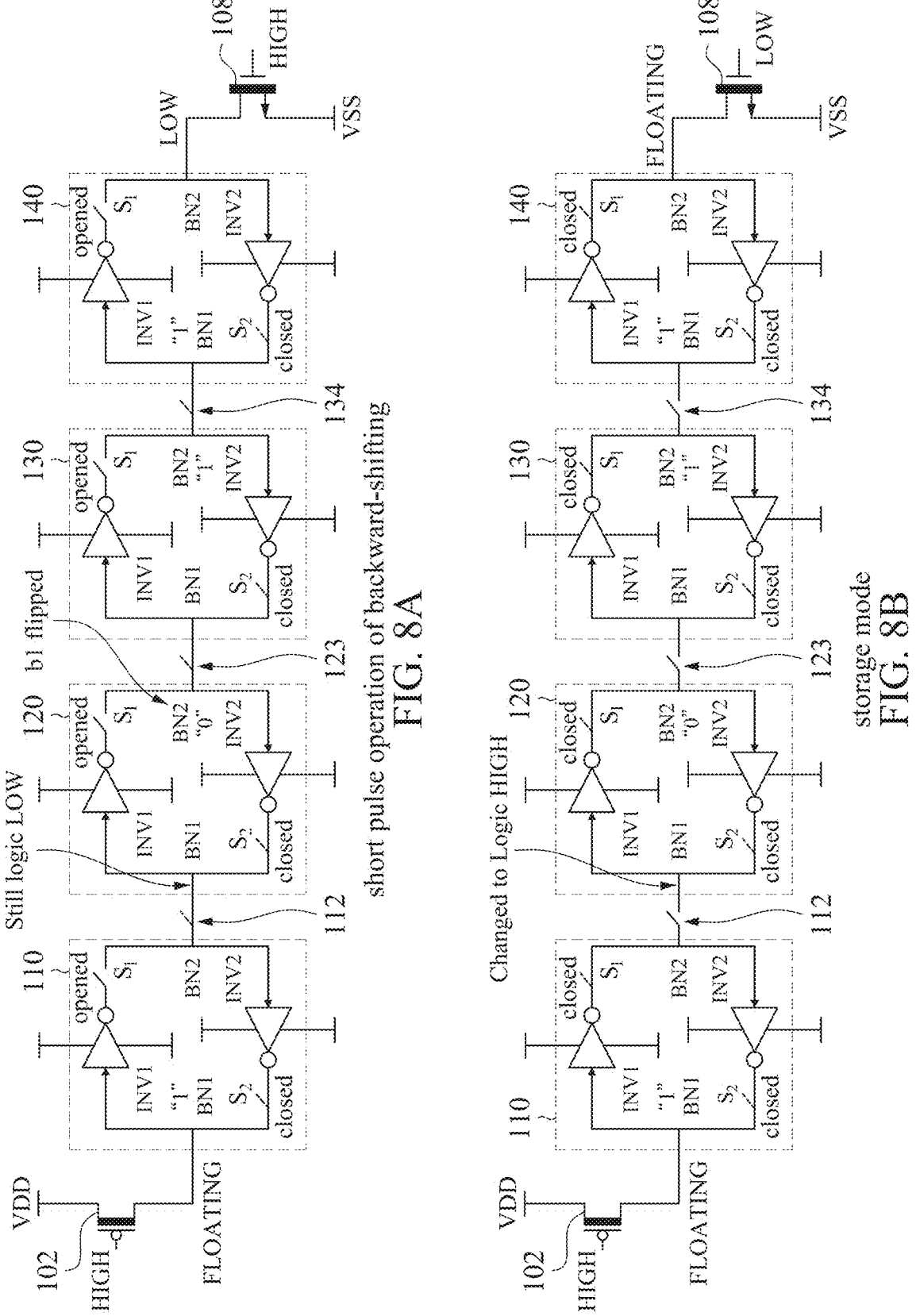

In FIGS. 8A-8B, before the short pulse operation of backward-shifting is applied to the storage device, the storage device is at the state "1111". During the short pulse operation, as shown in FIG. 8A, the storage device is set to the backward-shifting mode, and the voltage of the second bit node BN2 of the latching unit 120 is flipped to logic LOW (i.e., $b_1$="0"), because of the voltage of logic LOW at the first bit node BN1 of the latching unit 130. The time duration of the short pulse operation is designed to be sufficiently short to ensure that the second bit node BN2 of the latching unit 110 remains at logic LOW (which is correspondingly $b_0$="1" at the first bit node BN1 of the latching unit 110). That is, due to insufficient time of the short pulse operation, the voltage change at the second bit node BN2 of the latching unit 120 does not get propagated to the second bit node BN2 of the latching unit 110.

At the end of the short pulse operation, as shown in FIG. 8B, the storage device is set to the storage mode. After the inter-unit transmission switch 112 is set to the disconnected state, the first bit node BN1 of the latching unit 120 is flipped to logic HIGH by the second inverter INV2 in the latching unit 120, as the voltage of the second bit node BN2 of the latching unit 120 is held at logic LOW by the capacitance at the input of the second inverter INV2. Then, the first switch S1 in each latching unit is closed, and the storage device is stabilized at the state "1011".

Figures 9A, 9B:
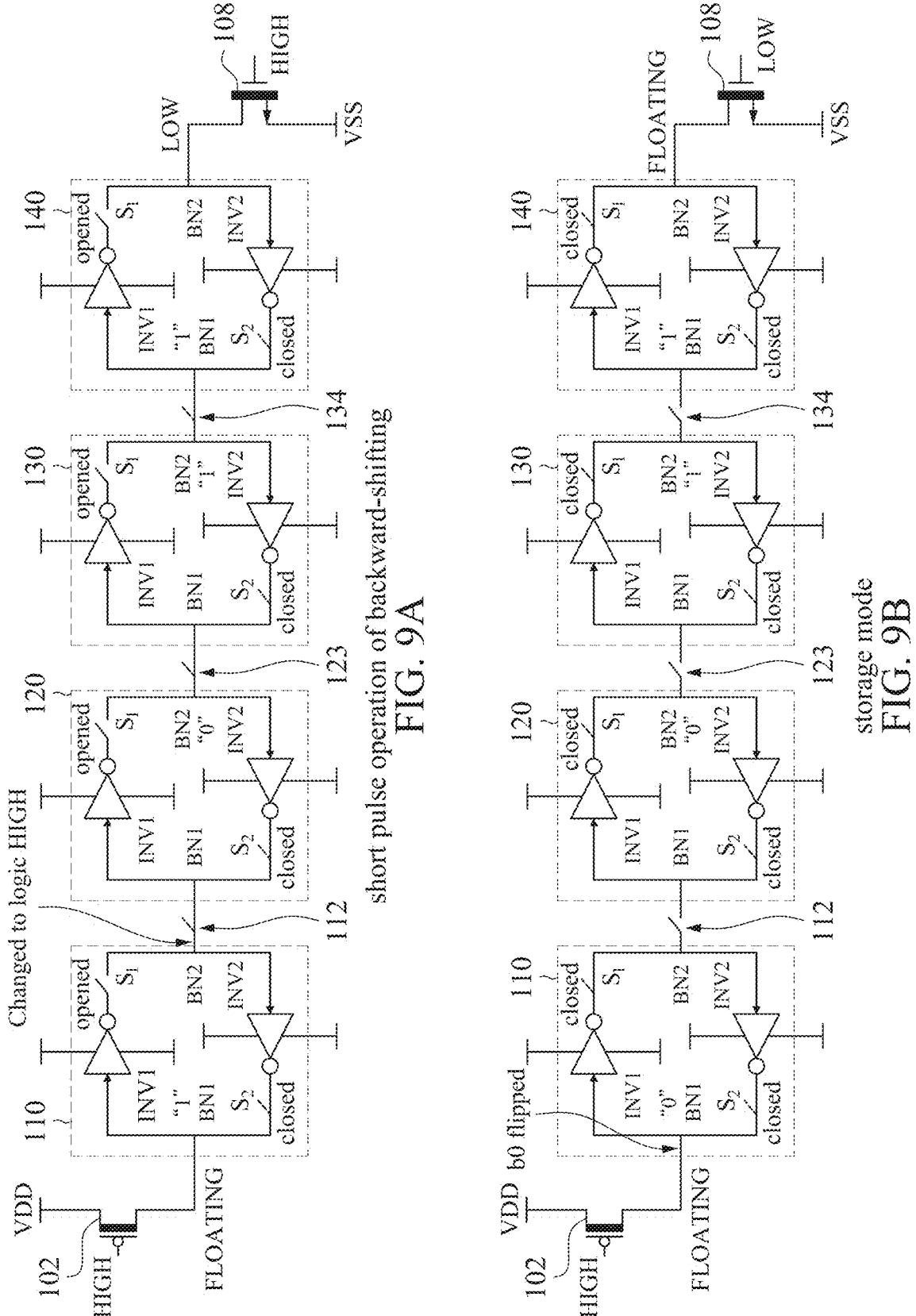

In FIGS. 9A-9B, before the short pulse operation of backward-shifting is applied to the storage device, the storage device is at the state "1011". During the short pulse operation, as shown in FIG. 9A, the storage device is set to the backward-shifting mode, and the voltage of the second bit node BN2 of the latching unit 110 is flipped to logic HIGH, because of the voltage of logic HIGH at the first bit node BN1 of the latching unit 120. In FIG. 9A, the first bit node BN1 of the latching unit 110 is still at logic HIGH.

The first bit node BN1 of the latching unit 120 is flipped to logic LOW by the second inverter INV2 in the latching unit 110 during the short pulse operation or at the end of the short pulse operation, as the voltage of the second bit node BN2 of the latching unit 110 is held at logic HIGH by the capacitance at the input of the second inverter INV2. At the end of the short pulse operation, as shown in FIG. 9B, the storage device is set to the storage mode. The first switch S1 in each latching unit is closed, and the storage device is stabilized at the state "0011".

Figure 10:
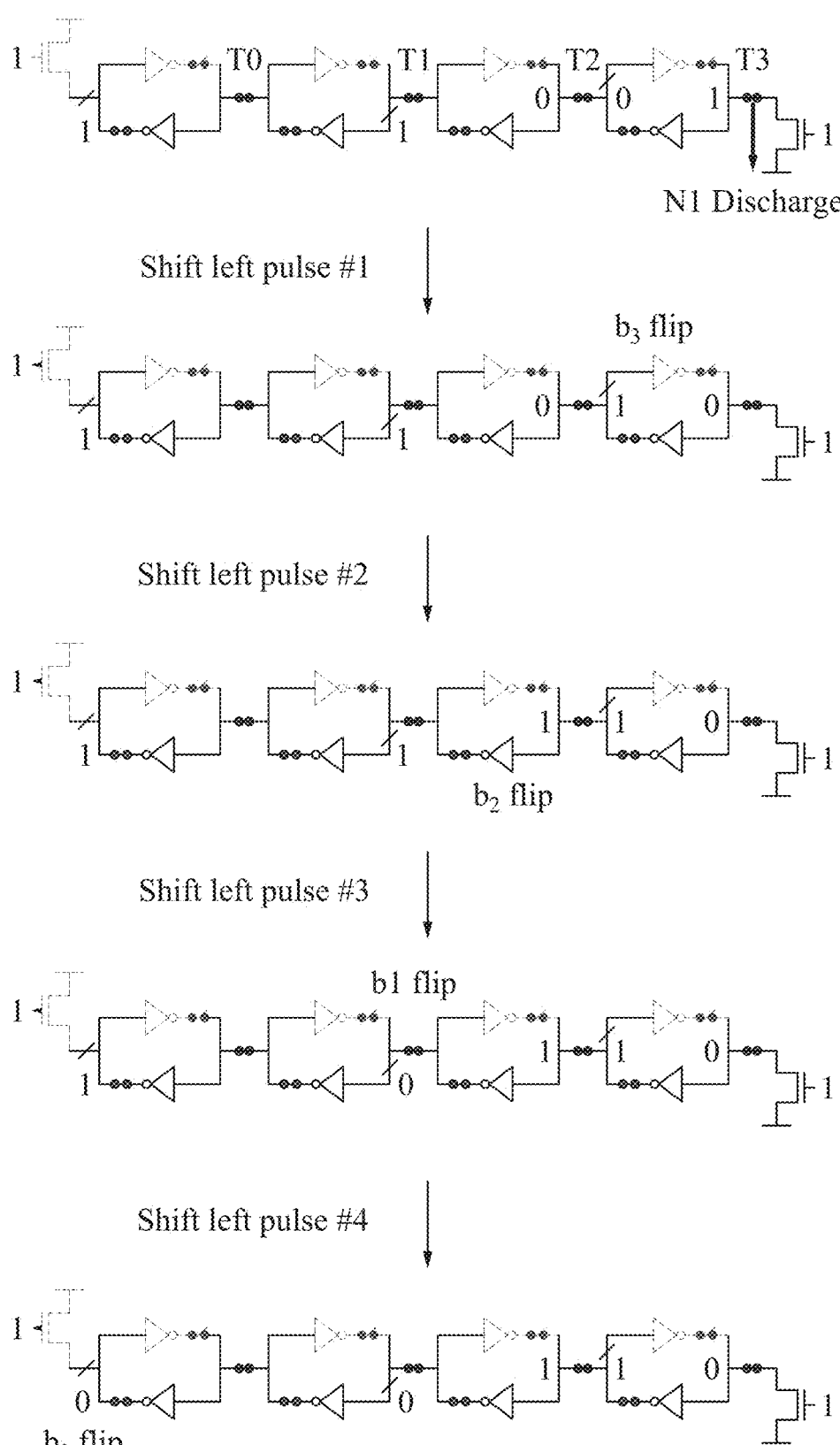
FIG. 10 is a schematic of a process of applying short pulse operations repetitively to a storage device, in accordance with some embodiments.

FIG. 10 is a schematic of a process of applying short pulse operations repetitively to a storage device, in accordance with some embodiments. The storage device is initially set to the state "1100" with a long pulse operation of forward-shifting, and an example of the long pulse operation is described with reference to FIGS. 5A-5B. The storage device is then sequentially subject to four short pulse operations of backward-shifting. After a first short pulse operation of backward-shifting, the state "1100" of the storage device is changed to the state "1101", and an example of the first short pulse operation is described with reference to FIGS. 6A-6B provide. After a second short pulse operation of backward-shifting, the state "1101" of the storage device is changed to the state "1111", and an example of the second short pulse operation is described with reference to FIGS. 7A-7B. After a third short pulse operation of backward-shifting, the state "1111" of the storage device is changed to the state "1011", and an example of the third short pulse operation is described with reference to FIGS. 8A-8B. After a fourth short pulse operation of backward-shifting, the state "1011" of the storage device is changed to the state "0011", and an example of the fourth short pulse operation is described with reference to FIGS. 9A-9B.

Figure 11:
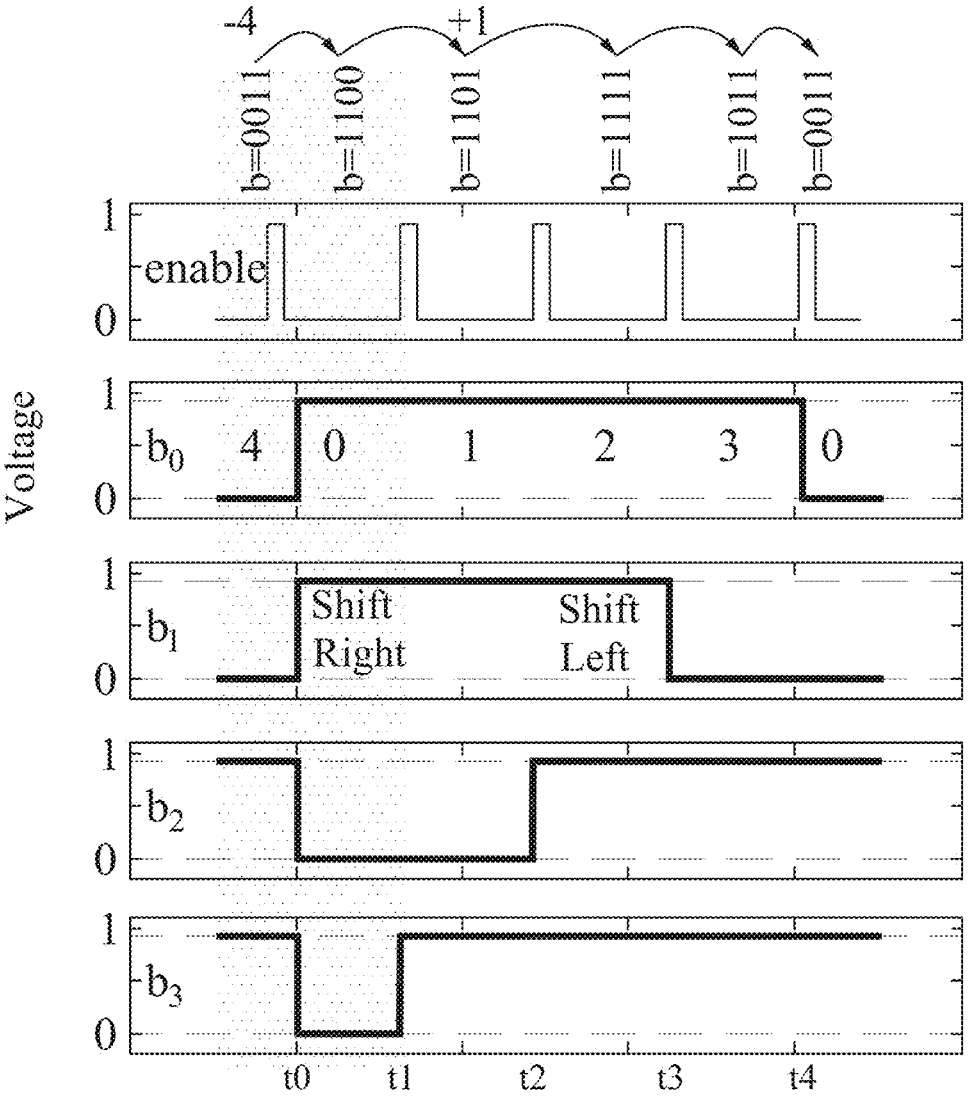
FIG. 11 is a timing diagram of a process of applying various short pulse operations of backward-shifting and long pulse operations of forward-shifting to a storage device, in accordance with some embodiments.

FIG. 11 is a timing diagram of a process of applying various short pulse operations of backward-shifting and long pulse operations of forward-shifting to a storage device, in accordance with some embodiments. In the example of FIG. 11, the state of the storage device at "0011" before time t0. As shown in the timing diagram of FIG. 11, in response to a long pulse operation of forward-shifting being applied to the storage device, at time t0, the state of the storage device is changed to "1100". In response to a first short pulse operation of backward-shifting being applied to the storage device, at time t1, the state of the storage device is changed to "1101". In response to a second short pulse operation of backward-shifting being applied to the storage device, at time t2, the state of the storage device is changed to "1111". In response to a third short pulse operation of backward-shifting being applied to the storage device, at time t3, the state of the storage device is changed to "1011". In response to a fourth short pulse operation of backward-shifting being applied to the storage device, at time t4, the state of the storage device is changed to "0011". The effect on the storage device by each of the four short pulse operations between time to to time t4 is depicted in the schematic of FIG. 10.

In addition to the long pulse operation of forward-shifting and the short pulse operation of backward-shifting, a short pulse operation of forward-shifting is also implemented for the storage device having latching units. The short pulse operation of forward-shifting and the short pulse operation of backward-shifting are mutually inverse operation of each other. For example, while a short pulse operation of backward-shifting changes a storage device from the state "1100" to the state "1101", a short pulse operation of forward-shifting changes the storage device from the state "1101" back to the state "1100". While a short pulse operation of backward-shifting changes a storage device from the state "1101" to the state "1111", a short pulse operation of forward-shifting changes the storage device from the state "1111" back to the state "1101". While a short pulse operation of backward-shifting changes a storage device from the state "1111" to the state "1011", a short pulse operation of forward-shifting changes the storage device from the state "1011" back to the state "1111". While a short pulse operation of backward-shifting changes a storage device from the state "1011" to the state "0011", a short pulse operation of forward-shifting changes the storage device from the state "0011" back to the state "1011".

FIGS. 12A-12B, FIGS. 13A-13B, FIGS. 14A-14B, and FIGS. 15A-15B are circuit diagrams of a storage device which has a state changed after a short pulse operation of forward-shifting, in accordance with some embodiments.

Figures 12A, 12B:
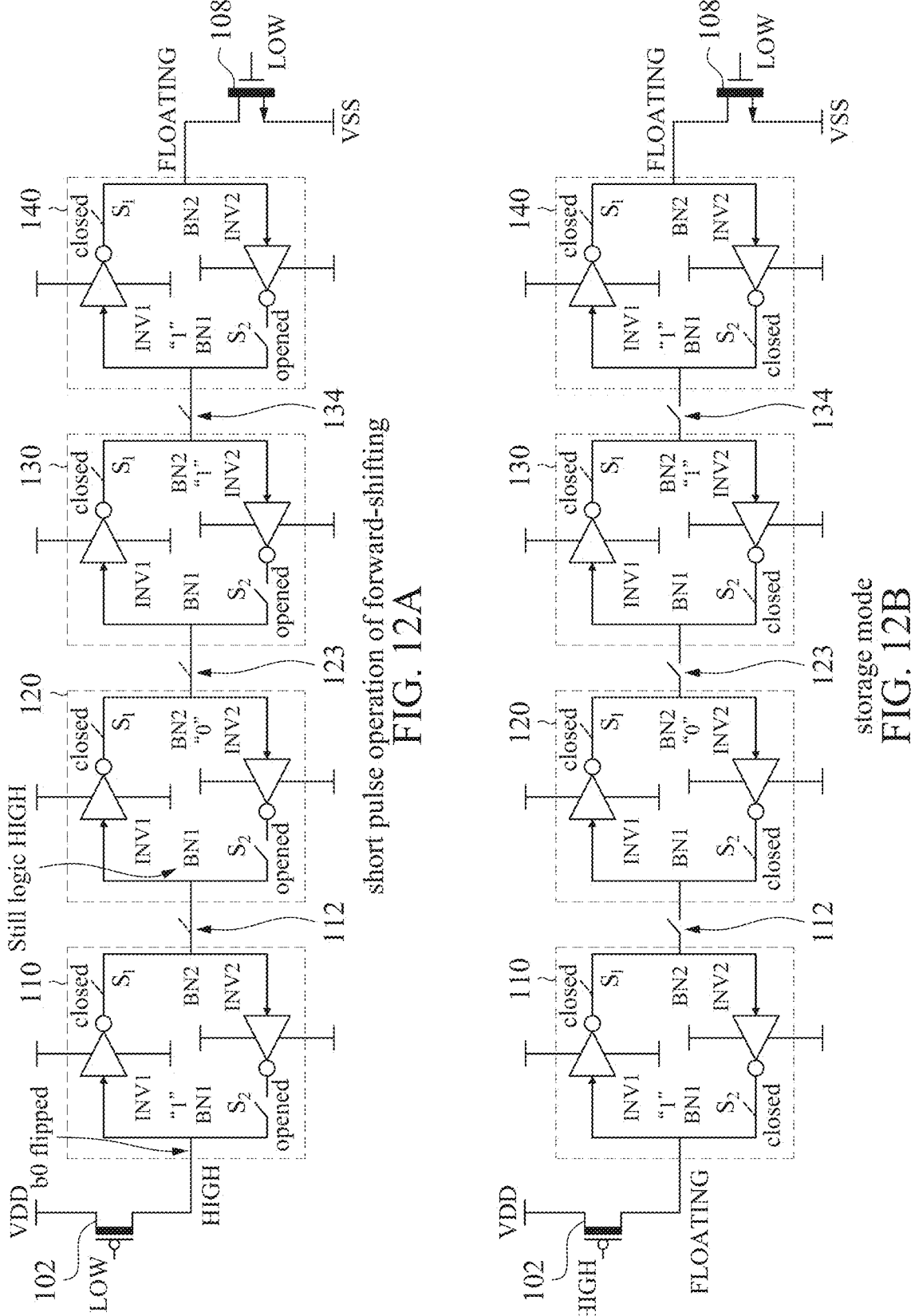
FIGS. 12A-12B, FIGS. 13A-13B, FIGS. 14A-14B, and FIGS. 15A-15B are circuit diagrams of a storage device which has a state changed after a short pulse operation of forward-shifting, in accordance with some embodiments.

In FIGS. 12A-12B, before the short pulse operation of forward-shifting is applied to the storage device, the storage device is at the state "0011". During the short pulse operation, as shown in FIG. 12A, the storage device is set to the forward-shifting mode, and the voltage of the first bit node BN1 of the latching unit 110 is held at logic HIGH. The time duration of the short pulse operation is designed to be sufficiently short to ensure that the first bit node BN1 of the latching unit 120 remains at logic HIGH. That is, due to insufficient time of the short pulse operation, a voltage change at the second bit node BN2 of the latching unit 110 does not get propagated to the second bit node BN2 of the latching unit 120. At the end of the short pulse operation, as shown in FIG. 12B, the storage device is set to the storage mode. After the inter-unit transmission switches are set to the disconnected state and the second switch S2 in each latching unit is closed, the storage device is stabilized at the state "1011".

Figures 13A, 13B:
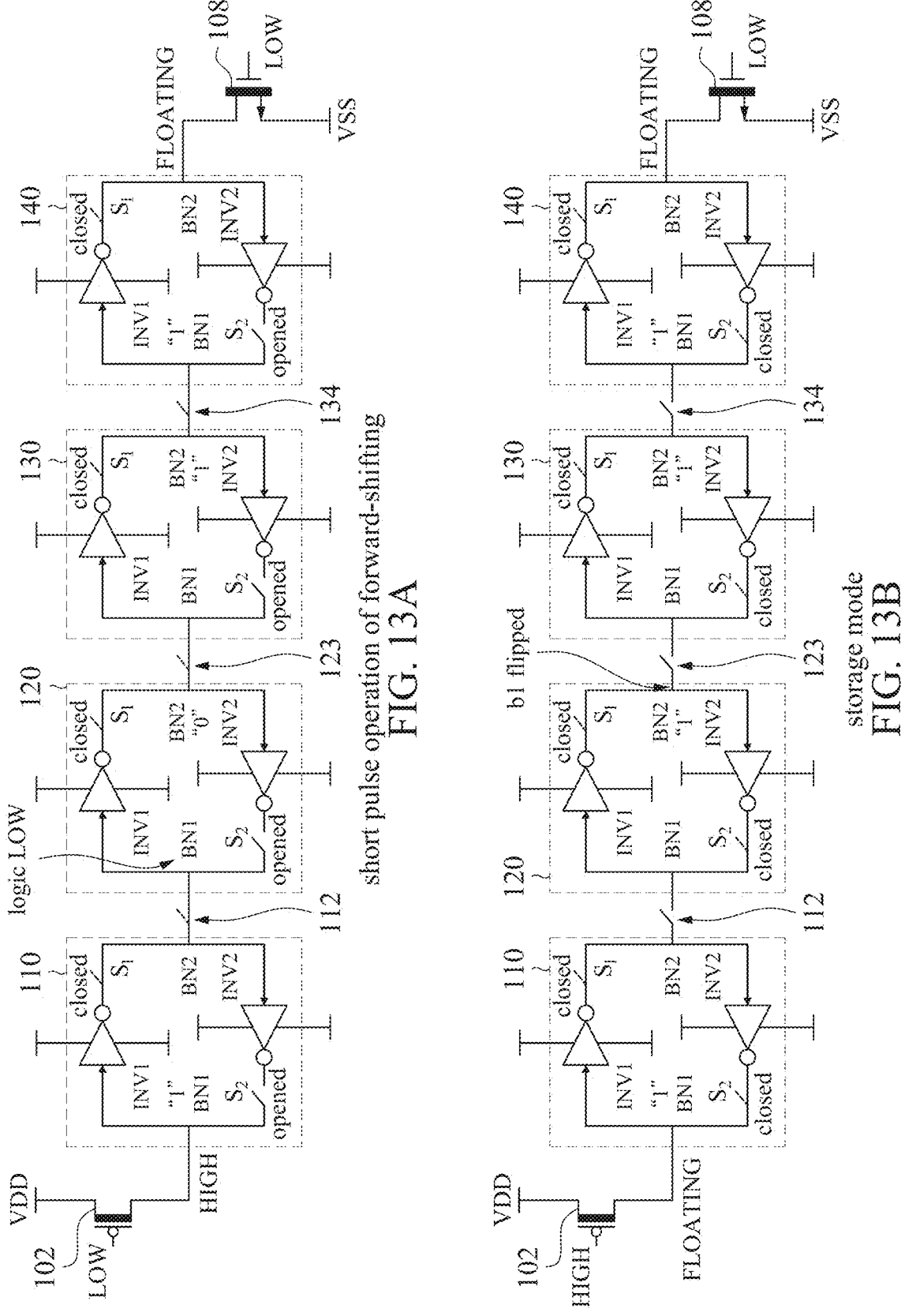

In FIGS. 13A-13B, before the short pulse operation of forward-shifting is applied to the storage device, the storage device is at the state "1011". During the short pulse operation, as shown in FIG. 13A, the storage device is set to the forward-shifting mode. As the inter-unit transmission switch 112 is set to the connected state, the voltage of the first bit node BN1 of the latching unit 120 is changed to logic LOW. The time duration of the short pulse operation is designed to be sufficiently short to ensure that the first bit node BN1 of the latching unit 130 remains at logic LOW. At the end of the short pulse operation, as shown in FIG. 13B, the storage device is set to the storage mode. After the inter-unit transmission switches are set to the disconnected state and the second switch S2 in each latching unit is closed, the storage device is stabilized at the state "1111".

Figures 14A, 14B:
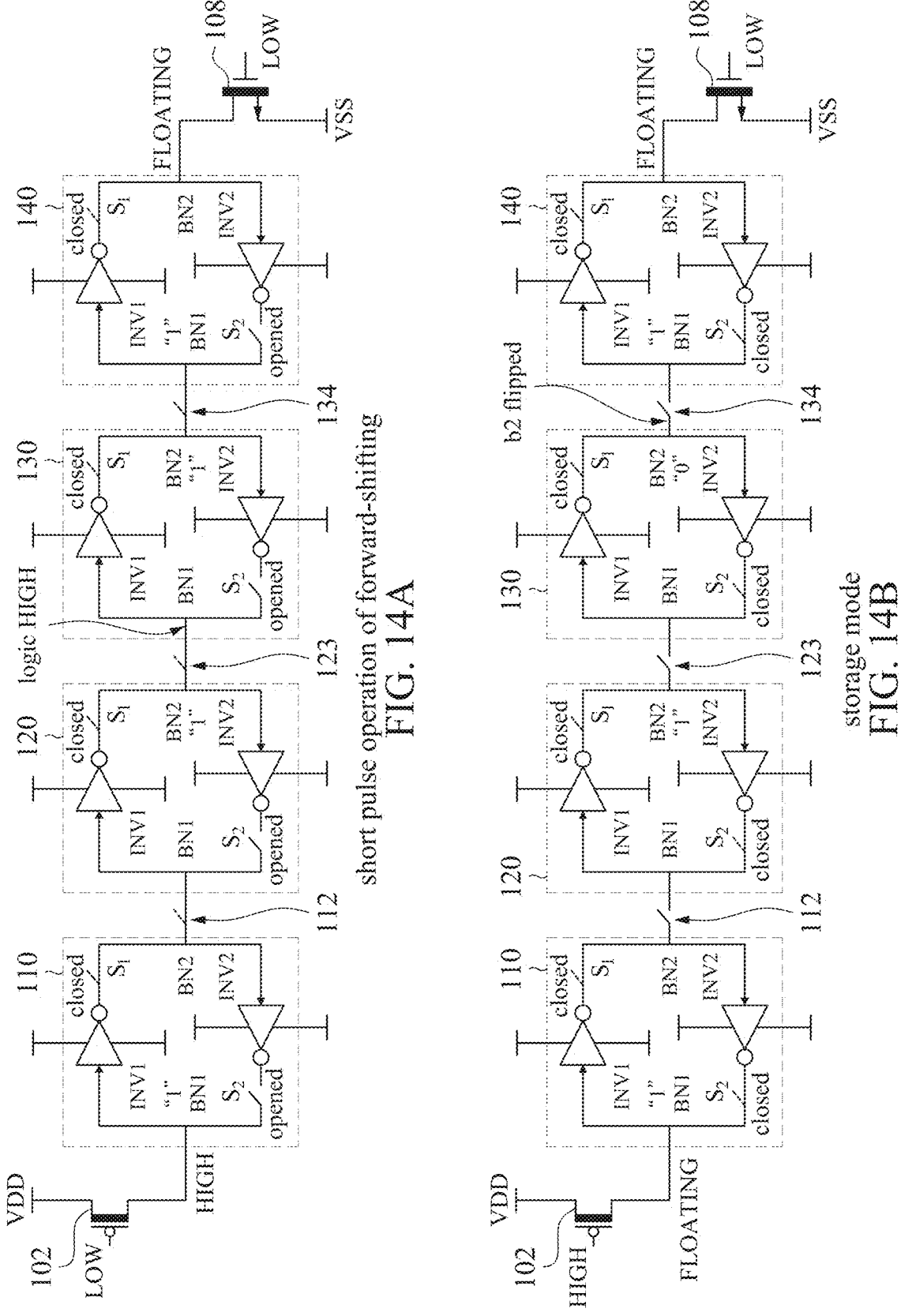

In FIGS. 14A-14B, before the short pulse operation of forward-shifting is applied to the storage device, the storage device is at the state "1111". During the short pulse operation, as shown in FIG. 14A, the storage device is set to the forward-shifting mode. As the inter-unit transmission switch 123 is set to the connected state, the voltage of the first bit node BN1 of the latching unit 130 is changed to logic HIGH. The time duration of the short pulse operation is designed to be sufficiently short to ensure that the first bit node BN1 of the latching unit 140 remains at logic HIGH. At the end of the short pulse operation, as shown in FIG. 14B, the storage device is set to the storage mode. After the inter-unit transmission switches are set to the disconnected state and the second switch S2 in each latching unit is closed, the storage device is stabilized at the state "1101".

Figures 15A, 15B:
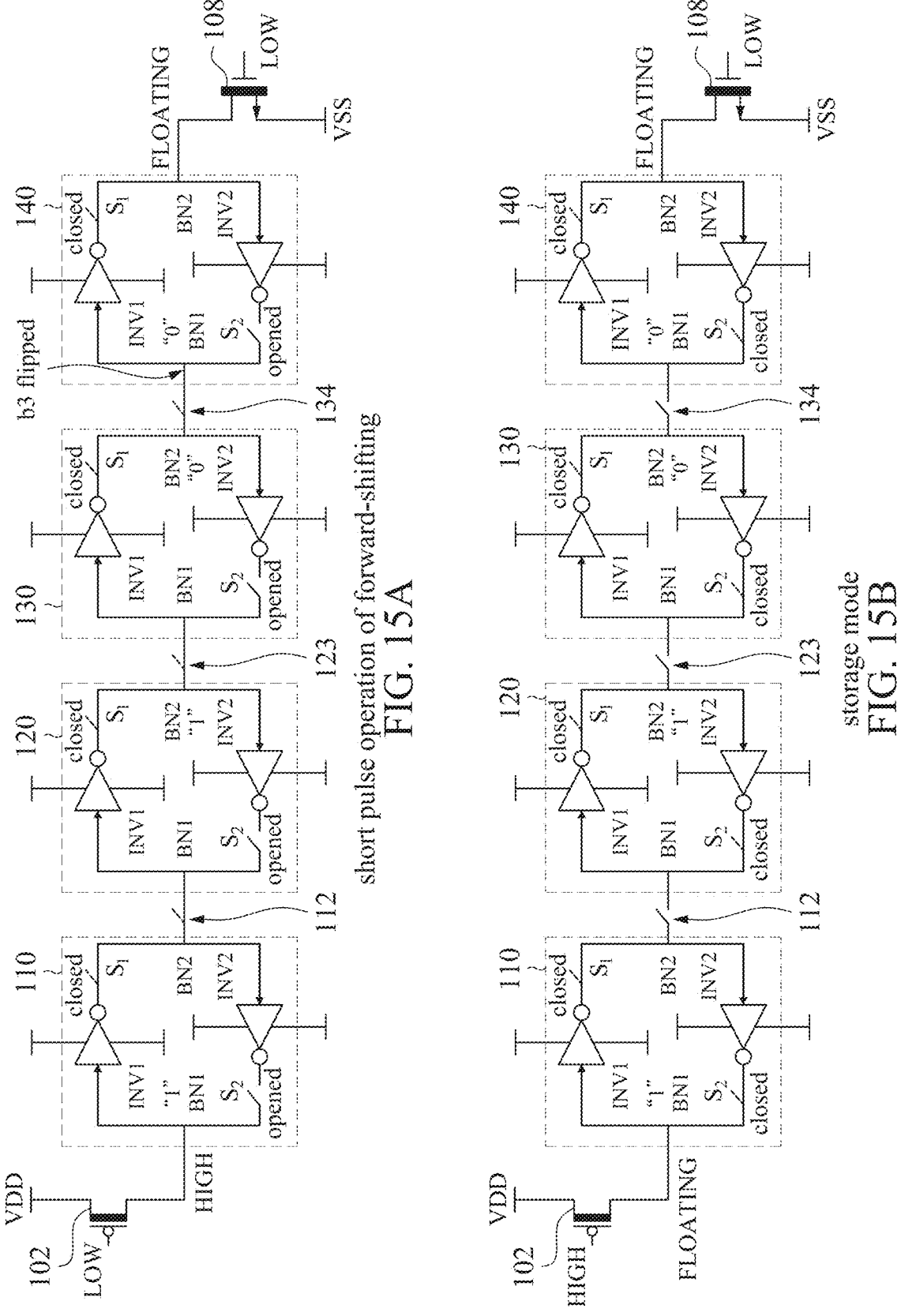

In FIGS. 15A-15B, before the short pulse operation of forward-shifting is applied to the storage device, the storage device is at the state "1111". During the short pulse operation, as shown in FIG. 15A, the storage device is set to the forward-shifting mode. As the inter-unit transmission switch 134 is set to the connected state, the voltage of the first bit node BN1 of the latching unit 140 is changed to logic LOW. The second bit node BN2 of the latching unit 140 remains floating as the gate of the NMOS transistor 108 is held at logic LOW. At the end of the short pulse operation, as shown in FIG. 14B, the storage device is set to the storage mode. After the inter-unit transmission switches are set to the disconnected state and the second switch S2 in each latching unit is closed, the storage device is stabilized at the state "1100".

FIG. 16 is a table of various coding schemes for coding the states of a storage device having latching units, in accordance with some embodiments. The coding scheme based on the states $b_0$, $b_1$, $b_2$, and $b_3$ of the latching units in FIG. 4 is listed in column 1630 of the table. The five states coded with the Thermometer-like coding scheme in column 1630 are the states 1100, 1101, 1111, 1011, and 0011, each of which is depicted schematically in FIG. 10.

In FIG. 16, with the Standard coding scheme, the codes 00, 01, 10, 11, and 100 in column 1610 represent correspondingly the states 1100, 1101, 1111, 1011, and 0011 in column 1630 under the Thermometer-like coding scheme. With the Thermometer coding scheme, the codes 0000, 0001, 0011, 0111, and 1111 in column 1620 represent correspondingly the states 1100, 1101, 1111, 1011, and 0011 in column 1630 under the Thermometer-like coding scheme.

With the Encoding-1 coding scheme, the codes 0, 1, 2, 3, and 4 in column 1640 represent correspondingly the states 1100, 1101, 1111, 1011, and 0011 in column 1630 under the Thermometer-like coding scheme. The short pulse operation of backward-shifting performs the arithmetic operation of adding one (i.e., +1), which changes the codes from 0 to 1, from 1 to 2, from 2 to 3, and from 3 to 4. The short pulse operation of forward-shifting performs the arithmetic operation of subtracting one (i.e., −1), which changes the codes from 1 to 0, from 2 to 1, from 3 to 2, and from 4 to 3. The long pulse operation of forward-shifting performs the arithmetic operation −4, which changes the codes from 4 to 0.

With the Encoding-2 coding scheme, the codes 0, 4, 8, 12, and 16 in column 1650 represent correspondingly the states 1100, 1101, 1111, 1011, and 0011 in column 1630 under the Thermometer-like coding scheme. The short pulse operation of backward-shifting performs the arithmetic operation of adding four (i.e., +4), which changes the codes from 0 to 4, from 4 to 8, from 8 to 12, and from 12 to 16. The short pulse operation of forward-shifting performs the arithmetic operation of subtracting four (i.e., −4), which changes the codes from 4 to 0, from 8 to 4, from 12 to 8, and from 16 to 8. The long pulse operation of forward-shifting performs the arithmetic operation −16, which changes the codes from 16 to 0.

With the Encoding-3 coding scheme, the codes 1, 2, 4, 8, and 16 in column 1660 represent correspondingly the states 1100, 1101, 1111, 1011, and 0011 in column 1630 under the Thermometer-like coding scheme. The short pulse operation of backward-shifting performs the arithmetic operation of multiplying by 2, which changes the codes from 1 to 2, from 2 to 4, from 4 to 8, and from 8 to 16 The short pulse operation of forward-shifting performs the arithmetic operation of dividing by 2, which changes the codes from 2 to 1, from 4 to 2, from 8 to 4, and from 16 to 8. The long pulse operation of forward-shifting performs the arithmetic operation of dividing by 16, which changes the codes from 16 to 1.

In FIG. 16, each of the Encoding-1 coding scheme and the Encoding-2 coding scheme is based on an arithmetic sequence, which is in the form of A, A+b, A+2b, A+3b, and A+4b. In the Encoding-1 coding scheme, the first term A=0, and the common difference b=1. In the Encoding-2 coding scheme, the first term A=0, and the common difference b=4. The Encoding-3 coding scheme is based on a geometric sequence, which is in the form of A, A*b, A*$b_2$, A*$b_3$, and A*$b_4$. In the Encoding-3 coding scheme, the first term A=1, and the common ratio b=2.

Figure 17:
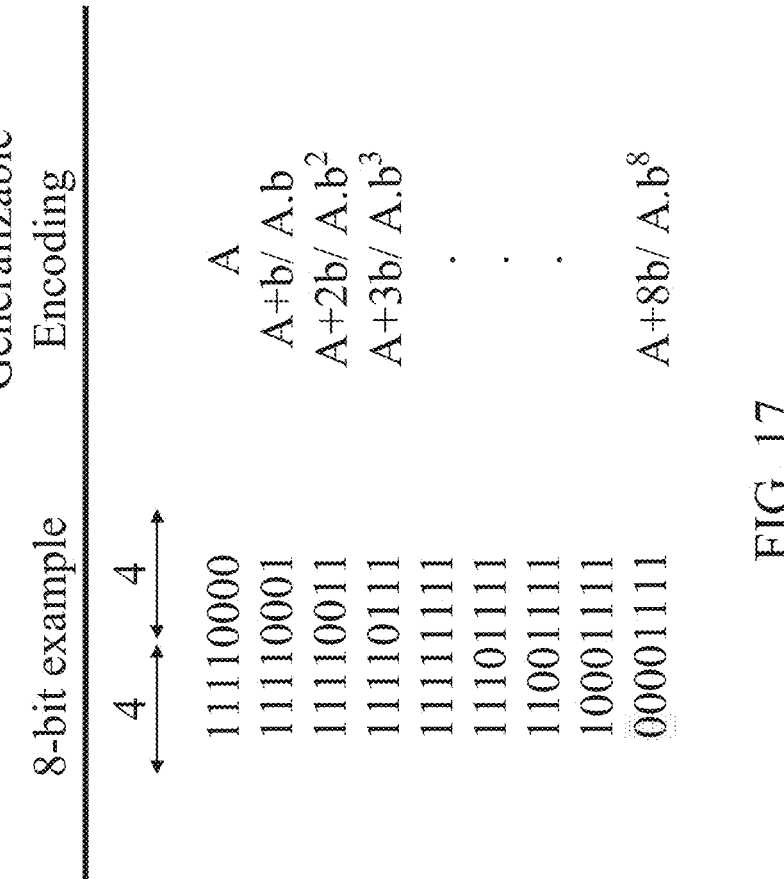
FIG. 17 is a table of various coding schemes for coding the states of a storage device having latching units, in accordance with some embodiments.

The coding schemes in FIG. 16 are based on a storage device that has four latching units, which forms a finite state machine of five states. The storage device implemented with four latching units connected with inter-unit transmission switches is provided as an example. In other implementations, a storage device having an array of N latching units connected with inter-unit transmission switches forms a finite state machine of N+1 states, where N is a positive integer. In some coding schemes, the N+1 states are represented by N+1 codes based on an arithmetic sequence of N+1 elements, which is in the form of A, A+1*b, A+2*b, A+3*b, . . . , and A+N*b. In some coding schemes, the N+1 states are represented by N+1 codes based on a geometric sequence, which is in the form of A, A*b, A*$b^2$, A*$b^3$, . . . , and A*$b^N$. As a specific example, for a storage device having an array of eight latching units (i.e., N=8), the coding schemes based on the arithmetic sequence and the geometric sequence are listed in a table in FIG. 17. The N+1 states (with N=8) represented by the Thermometer-like coding scheme are also listed in the first column of the table.

Figure 18:
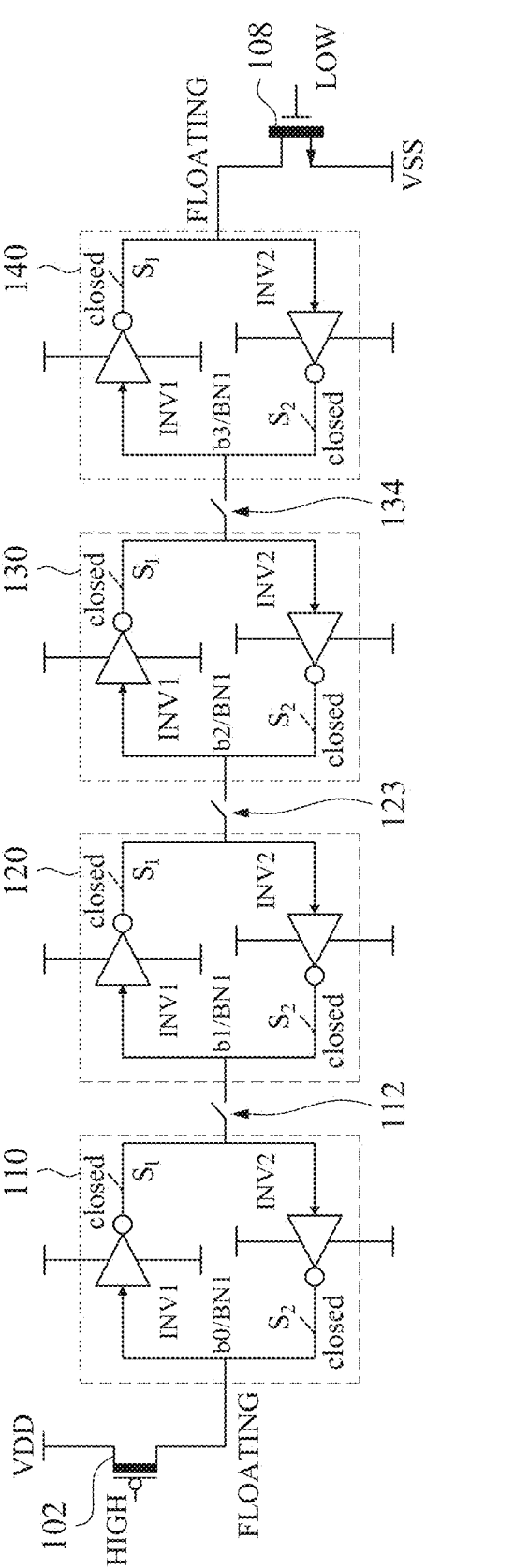
FIG. 18 is a circuit diagram of a storage device having an array of latching units, in accordance with some embodiments.

In the specific implementation of FIG. 4, the state of the storage device 100 is represented with the combination "$b_0b_1b_2b_3$", where the bit values $b_0$, $b_1$, $b_2$, and $b_3$ are correspondingly the voltage level at the first bit node BN1 of the latching unit 110, the voltage level at the second bit node BN2 of the latching unit 120, the voltage level at the second bit node BN2 of the latching unit 130, and the voltage level at the first bit node BN1 of the latching unit 140. In some alternative implementation, as shown in FIG. 18, the state of the storage device 100 is represented with the combination "$b_0b_1b_2b_3$", where the bit values $b_0$, $b_1$, $b_2$, and $b_3$ are correspondingly the voltage level at the first bit node BN1 of the latching unit 110, the voltage level at the first bit node BN1 of the latching unit 120, the voltage level at the first bit node BN1 of the latching unit 130, and the voltage level at the first bit node BN1 of the latching unit 140. In the state representation of FIG. 18, the five states of the storage device are "1010", "1011", "1001", "1101", and "0101".

In the specific implementations as shown in FIGS. 2A-2C, each of the inverters (i.e., the first inverter INV1 and the second inverter INV2) is implemented with a PMOS transistor and an NMOS transistor. Other implementations of the inverters in the latching units of a storage device are within the contemplated scope of present disclosure. Three example implementations of latching units which are usable in a storage device in present disclosure are shown in FIGS. 19A-19C.

Figure 19B:
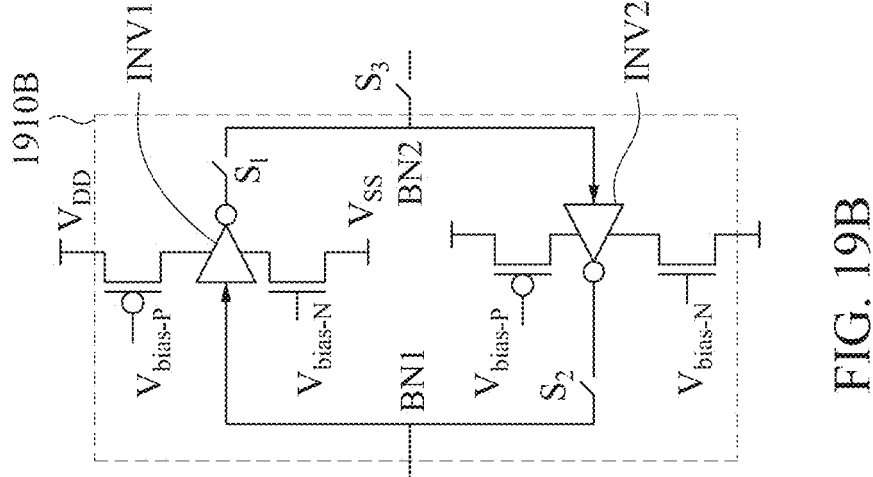
FIGS. 19A-19C are circuit diagrams of example implementations of latching units for use in a storage device.
Figure 19A:
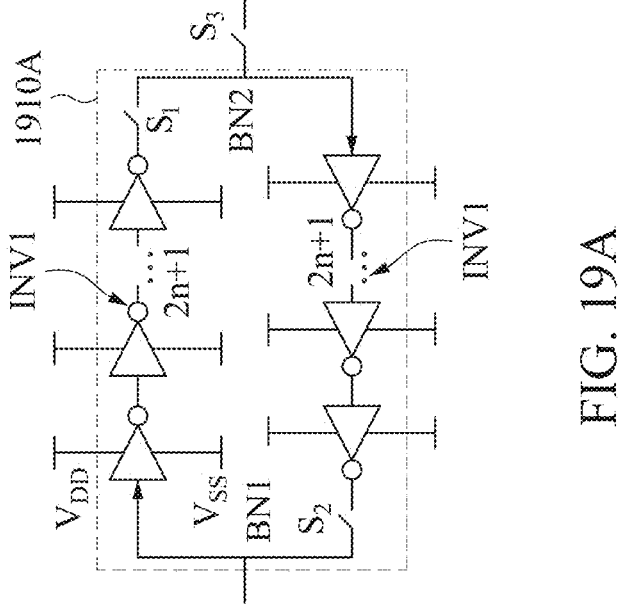

In FIG. 19A, each of the first inverter INV1 and the second inverter INV2 is implemented with 2n+1 serially connected single-stage inverters. In the examples of FIGS. 2A-2C, each inverter is implemented with a PMOS transistor and an NMOS transistor, which provides one example of a single-stage inverter. By changing the number of single-stage inverters for forming the first inverter INV1, the delay time of the first inverter INV1 is adjusted. By changing the number of single-stage inverters for forming the second inverter INV2, the delay time of the second inverter INV2 is adjusted.

In FIG. 19B, the first inverter INV1 is configured to receive the first supply voltage VDD though a PMOS transistor having a gate biased with a gate voltage $V_{bias-P}$ and configured to receive the second supply voltage VSS though an NMOS transistor having a gate biased with a gate voltage $V_{bias-N}$. The second inverter INV2 is similarly configured to receive the first supply voltage VDD and the second supply voltage VSS. By changing the gate voltage $V_{bias-P}$ and/or the gate voltage $V_{bias-N}$, the delay time of the first inverter INV1 and/or the second inverter INV2 is adjusted.

Figure 19C:
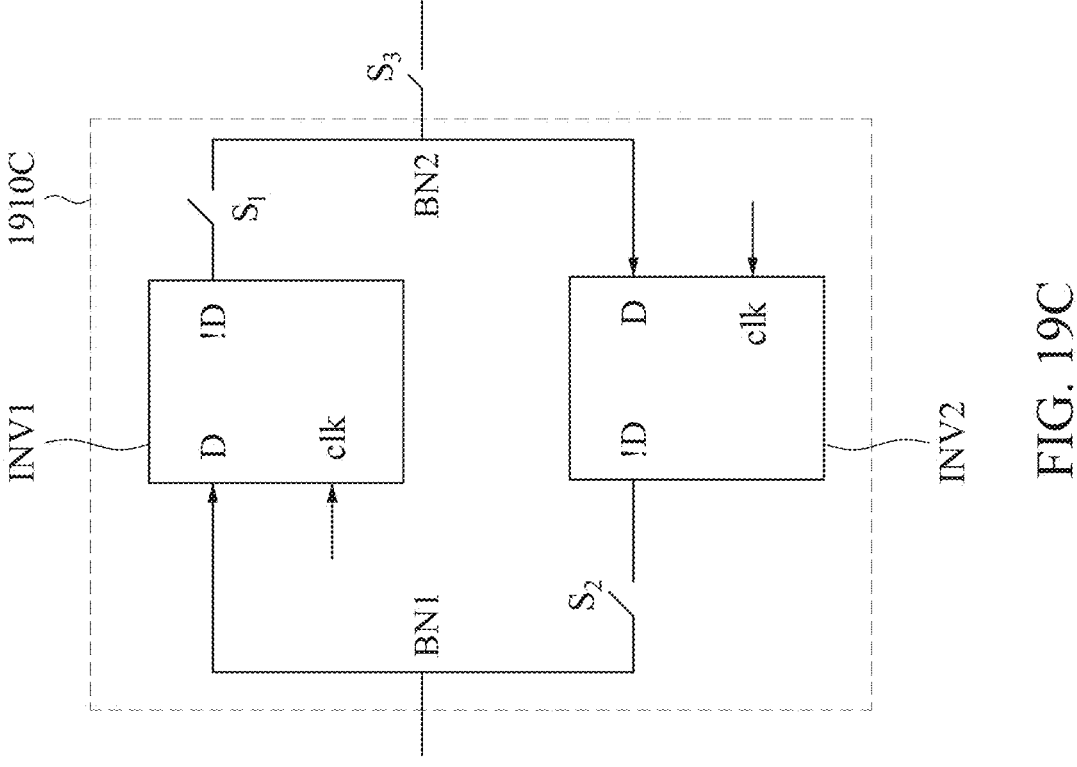

In FIG. 19C, each of the first inverter INV1 and the second inverter INV2 is implemented with a D flip-flop. In FIGS. 19A-19C, an inter-unit transmission switch S3 (which is connected to the second bit node BN2) is shown along with the latching units 1910A, 1910B, or 1910C.

Figure 20:
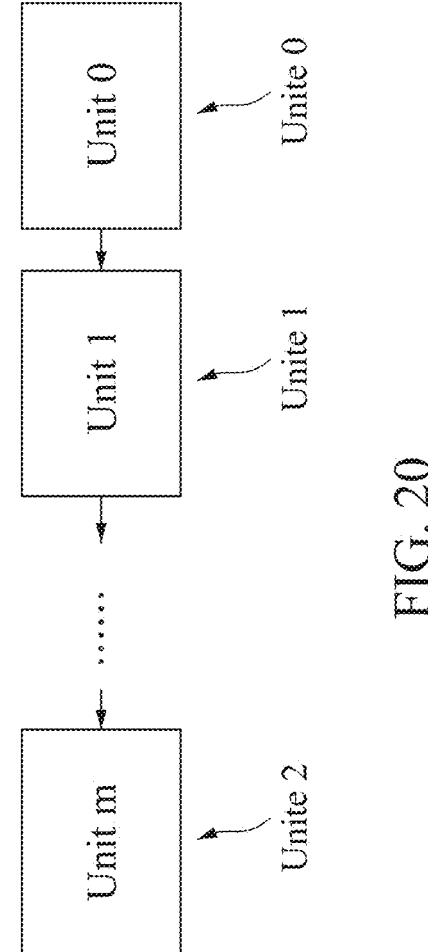
FIG. 20 is a schematic of a row of storage units, in accordance with some embodiments.

In some embodiments, as shown in FIG. 20, multiple storage devices are chained together to form a row of storage units. In FIG. 20, the row of storage units includes unit 0, unit 1, . . . , and unit m. Each storage unit includes a storage device. The output of unit 0 is connected to the input of the unit 1, the output of unit 1 is connected to the input of the unit 2, . . . , and the output of unit m−1 is connected to the input of the unit m. In some embodiments, in an example where the storage device 100 in FIG. 1 is used to implement a storage unit (e.g., unit 0, unit 1, . . . , or unit m) in FIG. 20, the second bit node BN2 of the last latching unit (i.e., 140) is implemented as the input of the storage unit, and the first bit node BN1 of the first latching unit (i.e., 110) is implemented to generate an output bit signal for the output of the storage unit.

Figure 21A:
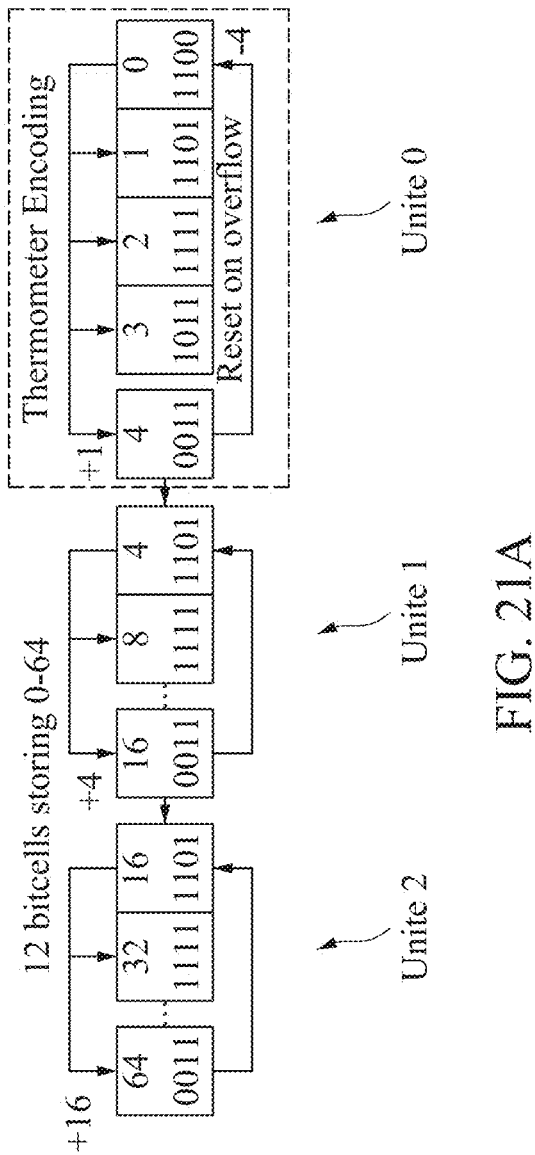
FIG. 21A is a schematic of a row of three storage units each having a storage device, in accordance with some embodiments.

FIG. 21A is a schematic of a row of three storage units each having a storage device, in accordance with some embodiments. In FIG. 21A, each storage device in a storage unit is implemented with four latching units, which is similar to the example implementing of FIG. 1. The storage device of unit 0 is implemented to code a first digit $q_0$ of a quaternary number and a corresponding carry bit of the first digit; in the storage device, each of the five states 1100, 1101, 1111, 1011, and 0011 correspondingly represents one of the five numbers 0, 1, 2, 3, and 4. The storage device of unit 1 is implemented to code a second digit $q_1$ of a quaternary number and a corresponding carry bit of the second digit; in the storage device, each of the five states 1100, 1101, 1111, 1011, and 0011 correspondingly represents one of the five numbers 0*4, 1*4, 2*4, 3*4, and 4*4. The storage device of unit 2 is implemented to code a third digit $q_2$ of a quaternary number and a corresponding carry bit of the third digit; in the storage device, each of the five states 1100, 1101, 1111, 1011, and 0011 correspondingly represents one of the five numbers $0*4^2$, $1*4^2$, $2*4^2$, $3*4^2$, and $4*4^2$.

The unit 0 is implemented to detect the overflow indicator "0" in the bit value $b_0$ in the state $b_0b_1b_2b_3$. The overflow indicator "0" in the bit values $b_0$ occurs in the event that the state is changed to 0011. In response to the occurrence of the overflow indicator "0", the unit 0 sends a carry bit signal to the unit 1, and the unit 0 is reset to the state 1100 with a long pulse operation of forward-shifting. In response to receiving the carry bit signal from unit 0, a short pulse operation of backward-shifting is performed on the storage device of unit 1.

Similarly, the unit 1 is implemented to detect the overflow indicator "0" in the bit value $b_0$ in the state $b_0b_1b_2b_3$. The overflow indicator "0" in the bit values $b_0$ occurs in the event that the state is changed to 0011. In response to the occurrence of the overflow indicator "0", the unit 1 sends a carry bit signal to the unit 2, and the unit 1 is reset to the state 1100 with a long pulse operation of forward-shifting. In response to receiving the carry bit signal from unit 1, a short pulse operation of backward-shifting is performed on the storage device of unit 2.

Similarly, the unit 2 is implemented to detect the overflow indicator "0" in the bit value $b_0$ in the state $b_0b_1b_2b_3$. The overflow indicator "0" in the bit values $b_0$ occurs in the event that the state is changed to 0011. In response to the occurrence of the overflow indicator "0", the unit 2 is reset to the state 1100 with a long pulse operation of forward-shifting, and the unit 2 optionally sends a carry bit signal to another circuit.

In FIG. 21A, the row of three storage units is configured to represent a coded number $q_0+q_1*4+q_2*4^2$. FIG. 21B is a table which maps the combination of the states of the three storage units (i.e., the unit 0, the unit 1, and unit 2) to the coded number written with decimal values.

In an example to show the row of three storage units of FIG. 21A in operation, when the row of three storage units is used represent the decimal value 3, the states of the unit 2, the unit 1, and unit 0 are correspondingly 1100, 1100, and 1011. In response to adding the decimal value 1 to the decimal value 3, a short pulse operation of backward-shifting is performed on the storage device of unit 0, which changes the state of the unit 0 from 1011 to 0011. Because of the overflow indicator "0" in the state 0011, the unit 0 sends a carry bit signal to the unit 1, and the unit 0 is reset to the state 1100 with a long pulse operation of forward-shifting. In response to receiving the carry bit signal from unit 0, a short pulse operation of backward-shifting is performed on the storage device of unit 1, and the state of the unit 1 is changed from 1100 to 1101. The state of the unit 2 remains at the 1100. At the end of the operation, after the decimal value 1 is added to the decimal value 3, the combination of the states of the three units (i.e., the unit 0, the unit 1, and unit 2) is 1100 1101 1100, which corresponds to the decimal value 4.

Figure 22:
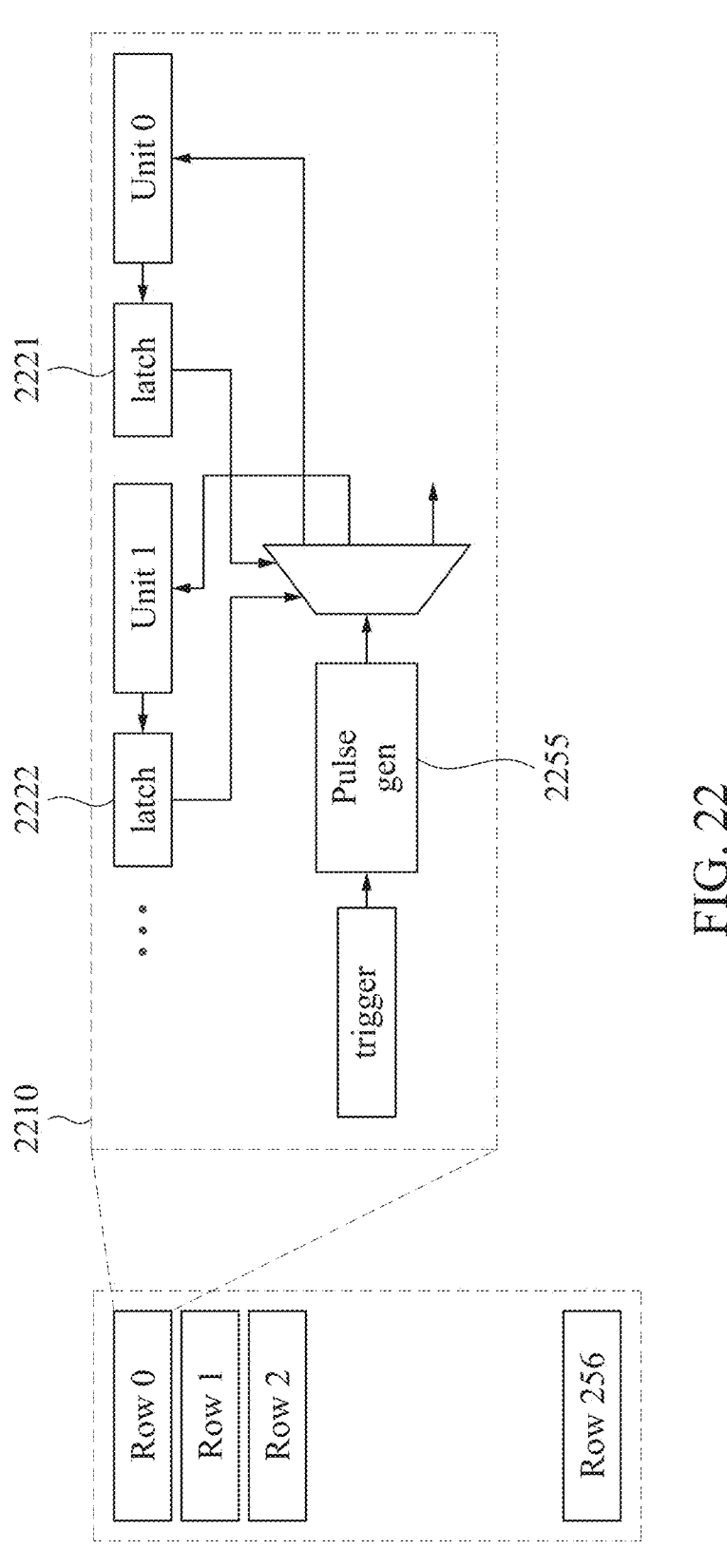
FIG. 22 is a schematic of multiple rows of storage units and an example row controller for a first row, in accordance with some embodiments.

In some embodiments, a matrix of storage units is formed with multiple rows of storage units, and each row is controlled with a corresponding row controller. FIG. 22 is a schematic of multiple rows of storage units and an example row controller 2210 for Row 0, in accordance with some embodiments. The multiple rows of storage units are arranged in Row 0, Row 1, Row 2, . . . , and Row 256. Each row of storage units includes multiple storage units (such as unit 0, unit 1, . . . , etc.). Each storage unit includes a storage device (such as the storage device 100 in FIG. 1) which has multiple latching units serially connected together. That is, each storage unit includes a storage device which has a first latching unit, a last latching unit, and remaining latching units serially coupled between the first latching unit and the last latching unit. In FIG. 22, each of the bit latch circuits 2221 and 2222 is associated with one of the storage units (i.e., unit 0 or unit 1), and each of the bit latch circuit 2221 and 2222 is coupled to the first bit node of a first latching unit (such as the first bit node BN1 of the latching unit 110 in FIG. 1) in the storage device of a corresponding the storage units (i.e., unit 0 or unit 1). Each of the bit latch circuit 2221 and 2222 is configured to catch a voltage at the first bit node of the first latching unit in the storage device of the corresponding the storage units (i.e., unit 0 or unit 1). In the example row controller 2210, various pulses are generated with a pulse generator 2255 for controlling the short pulse operation of backward-shifting, the long pulse operation of forward-shifting, and the short pulse operation of forward-shifting.

In some embodiments, whether an individual storage unit is subject to one of the short pulse and long pulse operations is individually controllable by a row controller, and thus the short pulse and/or long pulse operations are selectively performed on each storage unit. As an example, in some embodiments, a stored number coded with the quaternary number system $q_0+q_1*4+q_2*4^2$ is stored in the three storage units of FIG. 21A. For adding a number of the decimal value 1 to the stored number, a short pulse operation of backward-shifting is performed on the storage device of unit 0. For subtracting a number of the decimal value 1 from the stored number, a short pulse operation of forward-shifting is performed on the storage device of unit 0. For adding a number of the decimal value 4 to the stored number, a short pulse operation of backward-shifting is performed on the storage device of unit 1. For adding a number of the decimal value 16 to the stored number, a short pulse operation of backward-shifting is performed on the storage device of unit 2.

Figure 23A:
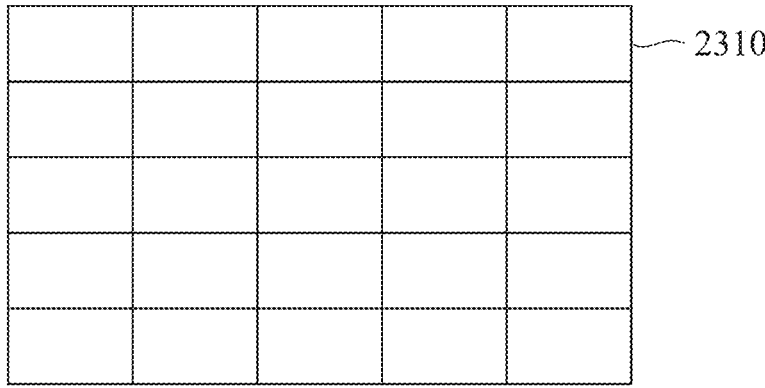
Figure 23B:
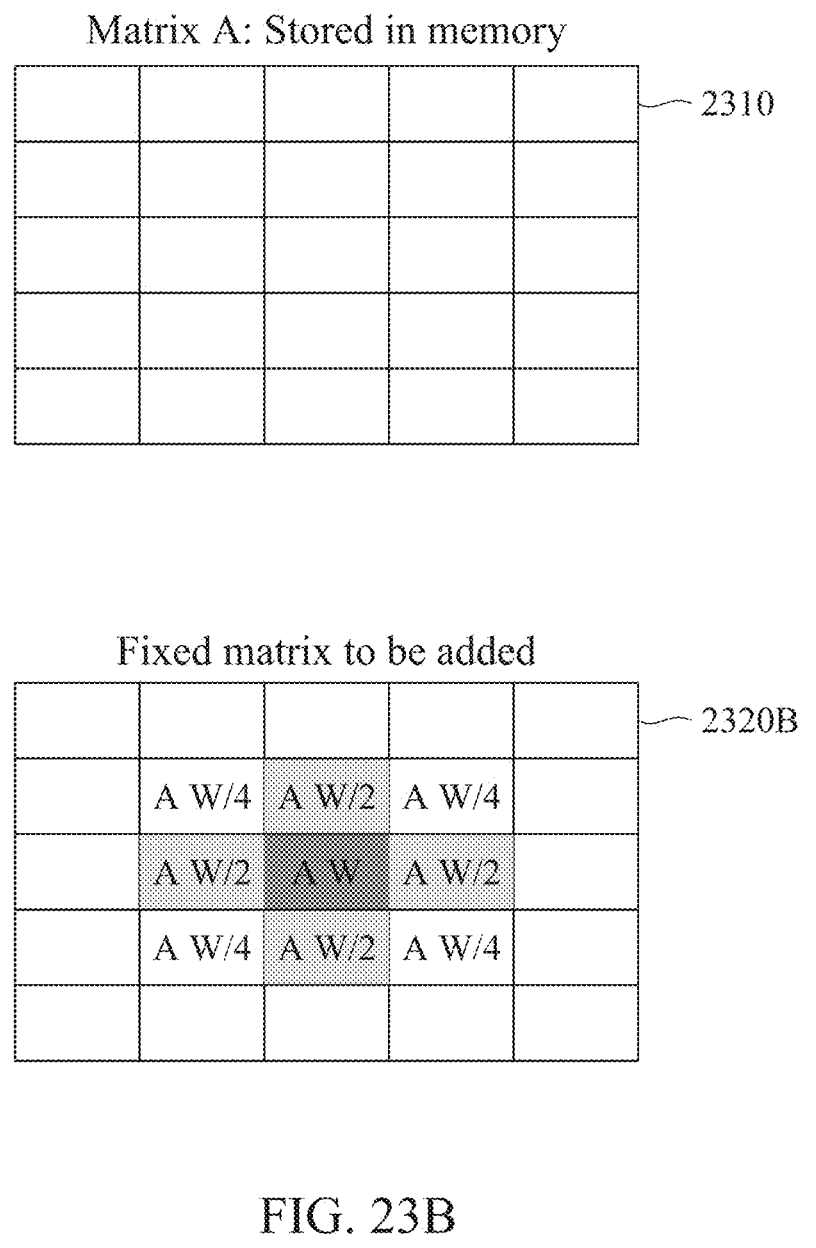

In some implementations, based on the system having a matrix of storage units formed with the multiple rows of storage units as shown in FIG. 22, the addition of two matrix is speeded up by performing multiple rows of addition concurrently. As each storage unit in a row is individually controlled for receiving one of the short pulse and long pulse operations, it becomes feasible to add different decimal values to different elements in a row of matrix. In one example, as shown in FIGS. 23A-23B, a first matrix 2310 is stored in the multiple rows of storage units in FIG. 22. For adding a second matrix 2320A or 2320B in FIGS. 23A-23B to the first matrix 2310, the short pulse operation of backward-shifting is selectively applied to corresponding storage units in FIG. 22. The second matrix 2320A includes a submatrix ((+1, +4, +1), (+4, +16, +4), (+1, +4, +1)). The second matrix 2320B includes a submatrix ((AW/4, AW/2, AW/4), (AW/2, AW, AW/2), AW/4, AW/2, AW/4)). Each element in the submatrix of the second matrix 2320A or 2320B is added to the corresponding element in the first matrix 2310 concurrently.

FIG. 24 is a flowchart of a method of operating a storage device, in accordance with some embodiments. The sequence in which the operations of method 2400 are depicted in FIG. 24 is for illustration only; the operations of method 2400 are capable of being executed in sequences that differ from that depicted in FIG. 24. It is understood that additional operations may be performed before, during, and/or after the method 2400 depicted in FIG. 24, and that some other processes may only be briefly described herein. The method 2400 includes operation 2410 and operation 2420.

In operation 2410, a long pulse operation of forward-shifting is performed on the storage device. The operation 2410 includes operation 2412 and operation 2414. In operation 2412, each latching unit in the array of latching units is set to a forward-connection mode for a duration of a long pulse. The operation 2412 also includes causing a voltage at the second bit node of the last latching unit at an end of the long pulse be settled to a level which is determined by the first voltage applied to the first bit node of the first latching unit. The second bit node of the last latching unit is set at floating during the long pulse. In the example as shown in FIG. 5A, each of the latching units 110-140 is set to a forward-connection mode, and the second bit node BN2 of the latching unit 140 is set at floating by maintaining the gate voltage of the NMOS transistor 108 at logic LOW. In FIG. 5A, the voltage at the second bit node BN2 of the latching unit 140 is determined by a voltage applied to the first bit node BN1 of the latching unit 110. In one example, the upper supply voltage VDD is applied to the first bit node BN1 of the latching unit 110 through the PMOS transistor 102. After the operation 2412, the process proceeds to operation 2414.

In operation 2414, each latching unit in the array of latching units is set to the latch mode and set each inter-unit transmission switch to a disconnected state. In the example embodiments in FIG. 5B, each of the latching units 110-140 is set to a latch mode and each of the inter-unit transmission switches 112, 123, and 134 is to the disconnected state.

In operation 2420, a short pulse operation of backward-shifting is performed on the storage device. The operation 2420 includes operation 2422 and operation 2424. In operation 2422, each latching unit in the array of latching units is set to a backward-connection mode for a duration of a short pulse. In the examples as shown in FIGS. 6A, 7A, 8A, and 9A, each of the latching units 110-140 is set to a backward-connection mode. After the operation 2422, the process proceeds to operation 2424.

In operation 2424, each latching unit in the array of latching units is set to a latch mode and set each inter-unit transmission switch to a disconnected state. In the example embodiments in FIGS. 6B, 7B, 8B, and 9B, each of the latching units 110-140 is set to a latch mode and each of the inter-unit transmission switches 112, 123, and 134 is to the disconnected state.

The operation 2422 also includes causing a voltage at the first bit node of a given latching unit at an end of the short pulse operation be settled to a level which is determined by an initial voltage at the second bit node of the given latching unit at a beginning of the short pulse operation.

In one example, at the beginning of the short pulse operation, as shown in FIG. 6A, the initial voltages at the second bit node BN2 of the latching units 110-140 are correspondingly at logic LOW, logic HIGH, logic LOW, logic LOW (at the drain of NMOS transistor 108). At the end of the short pulse operation, as shown in FIG. 6B, the voltages at the first bit node BN1 of the latching unit 110-140 are correspondingly at logic HIGH, logic LOW, logic HIGH, logic HIGH.

In another example, at the beginning of the short pulse operation, as shown in FIG. 7A, the initial voltages at the second bit node BN2 of the latching units 110-140 are correspondingly at logic LOW, logic HIGH, logic HIGH, logic LOW. At the end of the short pulse operation, as shown in FIG. 7B, the voltages at the first bit node BN1 of the latching unit 110-140 are correspondingly at logic HIGH, logic LOW, logic LOW, logic HIGH.

In some embodiments, the operation 2424 is repeated until a voltage level at the first bit node of the first latching unit is detected to be changed, then, another long pulse operation is performed on the storage device. In some example embodiments, the operation 2424 is repeated as shown in FIGS. 6A-6B, FIGS. 7A-7B, FIGS. 8A-8B, and FIGS. 9A-9B. In response to the voltage level at the first bit node BN1 of the latching unit 110 is changed from logic HIGH to logic LOW, as shown in FIG. 9B, a long pulse operation of forward-shifting (such as the operation as shown in FIGS. 5A-5B) is performed on the storage device.

FIG. 25 is a flowchart of a method of operating a storage device, in accordance with some embodiments. The sequence in which the operations of method 2500 are depicted in FIG. 25 is for illustration only; the operations of method 2500 are capable of being executed in sequences that differ from that depicted in FIG. 25. It is understood that additional operations may be performed before, during, and/or after the method 2500 depicted in FIG. 25, and that some other processes may only be briefly described herein. The method 2500 includes operation 2510, 2520, 2530, and 2540.

In operation 2510, each latching unit in the array of latching units is set to the forward-connection mode for a duration of a first time period. In the example as shown in FIG. 5A, each of the latching units 110-140 is set to a forward-connection mode. An example operation of the forward-connection mode is explained with reference to FIG. 3A.

In operation 2520, each latching unit in the array of latching units is set to the latch mode and each inter-unit transmission switch is set to a disconnected state. In the example embodiments in FIG. 5B, each of the latching units 110-140 is set to a latch mode and each of the inter-unit transmission switches 112, 123, and 134 is to the disconnected state. An example operation of the backward-connection mode is explained with reference to FIG. 3C.

In operation 2530, each latching unit in the array of latching units is set to the backward-connection mode for a duration of a second time period. In the examples as shown in FIGS. 6A, 7A, 8A, and 9A, each of the latching units 110-140 is set to a backward-connection mode. An example operation of the backward-connection mode is explained with reference to FIG. 3B.

In operation 2540, each latching unit in the array of latching units is set to the latch mode and each inter-unit transmission switch is set to a disconnected state. In the example embodiments in FIG. 6B, each of the latching units 110-140 is set to a latch mode and each of the inter-unit transmission switches 112, 123, and 134 is to the disconnected state. An example operation of the backward-connection mode is explained with reference to FIG. 3C.

An aspect of the present disclosure relates to a storage device. The storage device includes an array of latching units, and a plurality of inter-unit transmission switches. Each pair of two adjacent latching units is coupled together through an inter-unit transmission switch. Each latching unit includes a first inverter and a first transmission switch serially connected between a first bit node and a second bit node, the first inverter having an input configured to receive a voltage from the first bit node either directly or through the first transmission switch, and a second inverter and a second transmission switch serially connected between the second bit node and the first bit node, the second inverter having an input configured to receive a voltage from the second bit node either directly or through the second transmission switch.

Another aspect of the present disclosure relates to a method. The method includes setting each latching unit in an array of latching units to a forward-connection mode for a duration of a first time period while each inter-unit transmission switch in a plurality of inter-unit transmission switches is at a connected state, where each latching unit having a first bit node and a second bit node, where each pair of two adjacent latching units is coupled together through an inter-unit transmission switch which connects the second bit node in a first one of the two adjacent latching units with the first bit node in a second one of the two adjacent latching units; after the first time period, setting each latching unit in the array of latching units to a latch mode and setting each inter-unit transmission switch to a disconnected state; setting each latching unit in the array of latching units to a backward-connection mode for a duration of a second time period while each inter-unit transmission switch is at a connected state; and after the second time period, setting each latching unit in the array of latching units to a latch mode and setting each inter-unit transmission switch to a disconnected state.

Still another aspect of the present disclosure relates to a storage device. The storage device includes an array of at least four latching units, where each latching unit may include: a first inverter and a first transmission switch serially connected between a first bit node and a second bit node, the first inverter having an input configured to receive a voltage from the first bit node either directly or through the first transmission switch, and a second inverter and a second transmission switch serially connected between the second bit node and the first bit node, the second inverter having an input configured to receive a voltage from the second bit node either directly or through the second transmission switch. The device also includes a plurality of at least three inter-unit transmission switches, where each inter-unit transmission switch joining two adjacent latching units is configured to couple the second bit node of a first one of the two adjacent latching units with the first bit node of a second one of the two adjacent latching units.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. A storage device comprising:
an array of at least four latching units, wherein each latching unit comprises:
    a first inverter and a first transmission switch serially connected directly between a first bit node and a second bit node, the first inverter having an input configured to receive a voltage from the first bit node either directly or through the first transmission switch, and
    a second inverter and a second transmission switch serially connected directly between the second bit node and the first bit node, the second inverter having an input configured to receive a voltage from the second bit node either directly or through the second transmission switch; and
a plurality of inter-unit transmission switches, wherein each pair of two adjacent latching units is directly coupled together through an inter-unit transmission switch, wherein each inter-unit transmission switch is configured to be at a disconnected state during a time period in which both the first transmission switch and the second transmission switch in each latching unit are at a connected state.

2. The storage device of claim 1, wherein the inter-unit transmission switch is between the second bit node of a first one of the two adjacent latching units and the first bit node of a second one of the two adjacent latching units.

3. The storage device of claim 1, wherein the first bit node of a first latching unit is electrically connected to an upper supply voltage through a PMOS transistor.

4. The storage device of claim 3, wherein the first bit node of a first latching unit is coupled to a bit latch circuit configured to catch a voltage at the first bit node of the first latching unit.

5. The storage device of claim 1, wherein the second bit node of a last latching unit is electrically connected to a lower supply voltage through an NMOS transistor.

6. The storage device of claim 1, wherein each of the first transmission switch, the second transmission switch, and the inter-unit transmission switch is a transmission gate.

7. The storage device of claim 1, wherein the first inverter is coupled between the first bit node and the first transmission switch, and the first transmission switch is coupled between an output of the first inverter and the second bit node.

8. The storage device of claim 1, wherein the first transmission switch is coupled between the first bit node and the input of the first inverter, and the first inverter is coupled between the first transmission switch and the second bit node.

9. The storage device of claim 1, wherein the second inverter is coupled between the second bit node and the second transmission switch, and the second transmission switch is coupled between an output of the second inverter and the first bit node.

10. The storage device of claim 1, wherein the second transmission switch is coupled between the second bit node and the input of the second inverter, and the second inverter is coupled between the second transmission switch and the first bit node.

11. A method of comprising:

setting each latching unit in an array of latching units to a forward-connection mode for a duration of a first time period while each inter-unit transmission switch in a plurality of inter-unit transmission switches is at a connected state, wherein each latching unit having a first bit node and a second bit node, the array of latching units including at least four latching units, wherein each pair of two adjacent latching units is directly coupled together through an inter-unit transmission switch which connects the second bit node in a first one of the two adjacent latching units with the first bit node in a second one of the two adjacent latching units, and wherein each latching unit having the first bit node and the second bit node comprises a first inverter and a first transmission switch serially connected directly between the first bit node and the second bit node and also comprises a second inverter and a second transmission switch serially connected directly between the second bit node and the first bit node;

after the first time period, setting each latching unit in the array of latching units to a latch mode and setting each inter-unit transmission switch to a disconnected state;

setting each latching unit in the array of latching units to a backward-connection mode for a duration of a second time period while each inter-unit transmission switch is at a connected state; and after the second time period, setting each latching unit in the array of latching units to a latch mode and setting each inter-unit transmission switch to a disconnected state.

12. The method of claim 11, wherein:

the first inverter has an input coupled to the first bit node either directly or through the first transmission switch and the second inverter has an input coupled to the second bit node either directly or through the second transmission switch.

13. The method of claim 12, wherein setting each latching unit in the array of latching units to the forward-connection mode comprises:

setting the first transmission switch in each latching unit to a connected state; and setting the second transmission switch in each latching unit to a disconnected state.

14. The method of claim 12, wherein setting each latching unit in the array of latching units the backward-connection mode comprises:

setting the first transmission switch in each latching unit to a disconnected state; and setting the second transmission switch in each latching unit to a connected state.

15. The method of claim 12, wherein setting each latching unit in the array of latching units to the latch mode comprises:

setting the first transmission switch in each latching unit to a disconnected state; and setting the second transmission switch in each latching unit to a disconnected state.

16. A storage device comprising:

an array of at least four latching units, wherein each latching unit comprises:

a first inverter and a first transmission switch serially connected directly between a first bit node and a second bit node, the first inverter having an input configured to receive a voltage from the first bit node either directly or through the first transmission switch, and a second inverter and a second transmission switch serially connected directly between the second bit node and the first bit node, the second inverter having an input configured to receive a voltage from the second bit node either directly or through the second transmission switch; and a plurality of at least three inter-unit transmission switches, wherein each inter-unit transmission switch joining two adjacent latching units is configured to couple directly the second bit node of a first one of the two adjacent latching units with the first bit node of a second one of the two adjacent latching units, wherein each inter-unit transmission switch is configured to be at a disconnected state during a time period in which both the first transmission switch and the second transmission switch in each latching unit are at a connected state.

17. The storage device of claim 16, wherein the first inverter is coupled between the first bit node and the first transmission switch, and the first transmission switch is coupled between an output of the first inverter and the second bit node.

18. The storage device of claim 16, wherein the first transmission switch is coupled between the first bit node and the input of the first inverter, and the first inverter is coupled between the first transmission switch and the second bit node.

19. The storage device of claim 16, wherein the second inverter is coupled between the second bit node and the second transmission switch, and the second transmission switch is coupled between an output of the second inverter and the first bit node.

20. The storage device of claim 16, wherein the second transmission switch is coupled between the second bit node and the input of the second inverter, and the second inverter is coupled between the second transmission switch and the first bit node.

* * * * *